(12) United States Patent
Park

(10) Patent No.: US 11,948,658 B2
(45) Date of Patent: Apr. 2, 2024

(54) ACCUMULATOR, OPERATIONAL LOGIC CIRCUIT INCLUDING ACCUMULATOR, AND PROCESSING-IN-MEMORY DEVICE INCLUDING ACCUMULATOR

(71) Applicant: SK hynix Inc., Icheon-si (KR)

(72) Inventor: Joon Hong Park, Icheon-si (KR)

(73) Assignee: SK hynix Inc., Icheon-si (KR)

(*) Notice: Subject to any disclaimer, the term of this patent is extended or adjusted under 35 U.S.C. 154(b) by 36 days.

(21) Appl. No.: 17/736,465

(22) Filed: May 4, 2022

(65) Prior Publication Data

US 2023/0206967 A1    Jun. 29, 2023

(30) Foreign Application Priority Data

Dec. 24, 2021   (KR) .................. 10-2021-0187822

(51) Int. Cl.
*G11C 7/10*      (2006.01)
*G06F 7/544*     (2006.01)

(52) U.S. Cl.
CPC ............ *G11C 7/106* (2013.01); *G06F 7/5443* (2013.01); *G11C 7/1048* (2013.01); *G11C 7/1057* (2013.01); *G11C 7/1084* (2013.01); *G11C 7/1087* (2013.01)

(58) Field of Classification Search
CPC ...... G11C 7/106; G11C 7/1048; G11C 7/1057; G11C 7/1084; G11C 7/1087; G06F 7/5443
See application file for complete search history.

(56) References Cited

U.S. PATENT DOCUMENTS

| | | | |
|---|---|---|---|
| 5,448,508 A * | 9/1995 | Ono ....................... | G06F 17/18 708/445 |
| 5,644,519 A * | 7/1997 | Yatim ................... | G06F 7/5443 708/523 |
| 11,494,326 B1 * | 11/2022 | Xu ........................... | G06N 3/06 |
| 2021/0081211 A1 | 3/2021 | Wang | |
| 2021/0240443 A1 * | 8/2021 | Chang ................... | G11C 13/004 |
| 2022/0171602 A1 * | 6/2022 | Jeon ...................... | G06F 7/5443 |

* cited by examiner

*Primary Examiner* — Ajay Ojha
(74) *Attorney, Agent, or Firm* — William Park & Associates Ltd.

(57) ABSTRACT

An accumulator includes an accumulating adder configured to add input data and latch data to output accumulation data, a selector configured to receive external data and the accumulation data, and output one of the external data and the accumulation data as selection data, and a latch circuit configured to latch the selection data output from the selector to transmit latched selection data into the accumulating adder as the latch data.

9 Claims, 24 Drawing Sheets

FIG.22

$$\begin{bmatrix} DW1.1 \cdots DW1.8 & DW1.9 \cdots DW1.16 & DW1.17 \cdots DW1.24 & DW1.25 \cdots DW1.32 \\ DW2.1 \cdots DW2.8 & DW2.9 \cdots DW2.16 & DW2.17 \cdots DW2.24 & DW2.25 \cdots DW2.32 \end{bmatrix}$$

WEIGHT MATRIX (31)

×

$$\begin{bmatrix} DV1.1 \\ \vdots \\ DV8.1 \\ DV9.1 \\ \vdots \\ DV16.1 \\ DV17.1 \\ \vdots \\ DV24.1 \\ DV25.1 \\ \vdots \\ DV32.1 \end{bmatrix}$$

VECTOR MATRIX (32)

$$= \begin{bmatrix} MAC\_RST11 \\ MAC\_RST12 \end{bmatrix}$$

MAC RESULT MATRIX (33)

ACCUMULATOR, OPERATIONAL LOGIC CIRCUIT INCLUDING ACCUMULATOR, AND PROCESSING-IN-MEMORY DEVICE INCLUDING ACCUMULATOR

CROSS-REFERENCE TO RELATED APPLICATIONS

The present application claims priority under 35 U.S.C. 119(a) to Korean Patent Application No. 10-2021-0187822, filed on Dec. 24, 2021, which is incorporated herein by reference in its entirety.

BACKGROUND

1. Technical Field

Various embodiments of the present disclosure relate to an accumulator, an operational logic circuit including the accumulator, and a processing-in-memory (hereinafter, referred to as "PIM") device including the accumulator.

2. Related Art

Recently, interest in artificial intelligence is rapidly increasing not only in the information technology (IT) industry, but also in the financial and medical industries. Accordingly, the introduction of artificial intelligence, more precisely, deep learning, is being considered and prototyped in various fields. In general, deep learning is a collective term for technology that effectively learns neural networks (DNNs) or deep networks that increase the number of layers in traditional neural networks and uses them for pattern recognition or inference.

One of the backgrounds and causes of such widespread interest in deep learning may be an improvement in the performance of a processor that performs an operation. To improve the performance of artificial intelligence, learning is performed by stacking up to hundreds of layers of neural networks. This trend has continued in recent years, and as a result, the amount of computation required for the hardware that performs the computation has increased exponentially. Moreover, in the case of the existing hardware system in which the memory and the processor are separated, the limitation of the amount of data communication between a memory and a processor hinders the improvement of the artificial intelligence hardware performance. To solve this problem, in recent years, as an artificial intelligence accelerator, a processing-in-memory (PIM) structure in which the processor and the memory are integrated in a semiconductor chip itself has been adopted. The processing-in-memory (PIM) device directly performs computational operations within the device using data stored in an internal memory inside the device, thereby improving data processing speed in a neural network.

SUMMARY

An accumulator according to an embodiment of the present disclosure may include an accumulating adder configured to add input data and latch data to output accumulation data, a selector configured to receive external data and the accumulation data, and output one of the external data and the accumulation data as selection data, and a latch circuit configured to latch the selection data output from the selector to transmit latched selection data into the accumulating adder as the latch data.

An operational logic circuit according to an embodiment of the present disclosure may include a multiplication circuit configured to perform a multiplication operation on first input data and second input data to output multiplication data, an addition circuit configured to add the multiplication data to output addition data, and an accumulator configured to perform an accumulation operation on the addition data. The accumulator may include an accumulating adder configured to add the addition data and latch data to output accumulation data, a selector configured to receive external data and the accumulation data and output one of the external data and the accumulation data as selection data, and a latch circuit configured to latch the selection data output from the selector and to transmit latched selection data into the accumulating adder as the latch data.

A PIM device according to an embodiment of the present disclosure may include a first operational logic unit configured to perform a first operation on a first set of first input data and a first set of second input data to output first operation result data, and a second operational logic unit configured to perform a second operation on a second set of the first input data and a second set of the second input data to output second operation result data. The second operational logic unit may be configured to receive the first operation result data from the first operational logic unit and to perform the second operation using the first operation result data as initial latch data.

A PIM device according to an embodiment of the present disclosure may include a first operational logic unit configured to perform a first operation on a first set of first input data and a first set of second input data to output first operation result data, a second operational logic unit configured to perform a second operation on a second set of the first input data and a second set of the second input data to output second operation result data, a third operational logic unit configured to perform a third operation on a third set of the first input data and a third set of the second input data to output third operation result data, and a fourth operational logic unit configured to perform a fourth operation on a fourth set of the first input data and a fourth set of the second input data to output fourth operation result data. The second operational logic unit may be configured to perform the second operation using the first operation result data from the first operational logic unit as initial latch data. The third operational logic unit may be configured to perform the third operation using the second operation result data from the second operational logic unit as initial latch data. In addition, the fourth operational logic unit may be configured to perform the fourth operation using the third operation result data from the third operational logic unit as initial latch data.

A PIM device according to an embodiment of the present disclosure may include a first even-numbered operational logic unit configured to perform a first operation on a first group of a first set of first input data and a first set of second input data to output first operation result data, a second even-numbered operational logic unit configured to perform a second operation on a first group of a second set of the first input data and the first set of the second input data to output second operation result data, a first odd-numbered operational logic unit configured to perform a third operation on a second group of the first set of the first input data and a second set of the second input data to output third operation result data, and a second odd-numbered operational logic unit configured to perform a fourth operation on a second group of the second set of the first input data and the second set of the second input data to output fourth operation result data. The first odd-numbered operational logic unit may be configured to perform the third operation using the first operation result data from the first even-numbered operational logic unit as initial latch data. The second odd-numbered operational logic unit may be configured to perform the fourth operation using the second operation result data from the second even-numbered operational logic unit as initial latch data.

BRIEF DESCRIPTION OF THE DRAWINGS

Certain features of the disclosed technology are illustrated by various embodiments with reference to the attached drawings.

FIG. 22 is a diagram illustrating another example of a MAC operation performed in the PIM device of FIG. 18.

DETAILED DESCRIPTION

Figure 1:
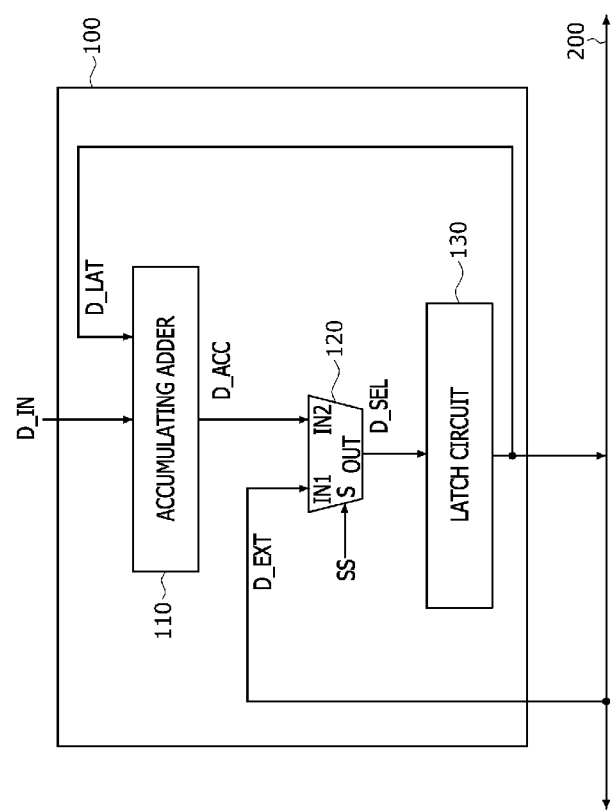
FIG. 1 is a block diagram illustrating an accumulator according to an embodiment of the present disclosure.

In the following description of embodiments, it will be understood that the terms "first" and "second" are intended to identify elements, but not used to define a particular number or sequence of elements. In addition, when an element is referred to as being located "on," "over," "above," "under," or "beneath" another element, it is intended to mean relative positional relationship, but not used to limit certain cases for which the element directly contacts the other element, or at least one intervening element is present between the two elements. Accordingly, the terms such as "on," "over," "above," "under," "beneath," "below," and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may be electrically or mechanically connected or coupled to the other element indirectly with one or more additional elements between the two elements.

Moreover, when a parameter is referred to as being "predetermined," it may be intended to mean that a value of the parameter is determined in advance of when the parameter is used in a process or an algorithm. The value of the parameter may be set when the process or the algorithm starts or may be set during a period in which the process or the algorithm is executed. A logic "high" level and a logic "low" level may be used to describe logic levels of electric signals. A signal having a logic "high" level may be distinguished from a signal having a logic "low" level. For example, when a signal having a first voltage corresponds to a signal having a logic "high" level, a signal having a second voltage may correspond to a signal having a logic "low" level. In an embodiment, the logic "high" level may be set as a voltage level which is higher than a voltage level of the logic "low" level. Meanwhile, logic levels of signals may be set to be different or opposite according to embodiment. For example, a certain signal having a logic "high" level in one embodiment may be set to have a logic "low" level in another embodiment. The words "simultaneous" and "simultaneously" as used herein with respect to operations mean that the operations take place on overlapping intervals of time. For example, if a first operation takes place over a first interval of time and a second operation takes place simultaneously over a second interval of time, then the first and second intervals at least partially overlap each other such that there exists a time at which the first and second operations are both taking place.

Various embodiments of the present disclosure will be described hereinafter in detail with reference to the accompanying drawings. However, the embodiments described herein are for illustrative purposes only and are not intended to limit the scope of the present disclosure. Although the various embodiments described below take a DRAM as an example as a memory device, it is obvious that the present disclosure is not limited thereto. The various embodiments may be equally applicable to, for example, SRAM, synchronous DRAM (SDRAM), double data rate synchronous DRAM (DDR SDRAM, DDR2 SDRAM, DDR3 SDRAM, etc.), graphics double data rate synchronous DRAM (GDDR, GDDR2, GDDR3 etc.), quad data rate dRAM (QDR DRAM), RAM BUS XDR DRAM (XDR DRAM), fast page mode DRAM (FPM DRAM), video DRAM (VDRAM), extended data output DRAM (EDO DRAM), burst EDO DRAM (BEDO DRAM), multibank DRAM (MDRAM), synchronous graphics RAM (SGRAM), and/or many other forms of DRAM.

Various embodiments are directed to an accumulator, an operational logic circuit including the accumulator, and a processing-in-memory (hereinafter, referred to as "PIM") device including the accumulator.

FIG. 1 is a block diagram illustrating an accumulator 100 together with a data input/output line 200 according to an embodiment of the present disclosure. Referring to FIG. 1, the accumulator 100 according to the present embodiment may include an accumulating adder 110, a selector 120, and a latch circuit 130. The accumulating adder 110 may receive input data D_IN from outside of the accumulator 100. The accumulating adder 110 may receive latch data D_LAT from the latch circuit 130. The accumulating adder 110 may add the input data D_IN and the latch data D_LAT and output accumulation data D_ACC as a result. The selector 120 may include a first input terminal IN1, a second input terminal IN2, a selection signal input terminal S, and an output terminal OUT.

In an embodiment, the selector 120 may be implemented with a 2:1 multiplexer. The selector 120 may receive external data D_EXT through the first input terminal IN1. The external data D_EXT may be transmitted to the first input terminal IN1 of the selector 120 through the data input/output line 200 outside the accumulator 100. The selector 120 may receive the accumulation data D_ACC output from the accumulating adder 110 through the second input terminal IN2. The selector 120 may receive a selection signal SS through the selection signal input terminal S. The selector 120 may output data selected by a logic level of the selection signal SS between the external data D_EXT and the accumulation data D_ACC as selection data D_SEL through the output terminal OUT. The latch circuit 130 may latch the selection data D_SEL output from the selector 120 and transmit the same to the accumulating adder 110 as the latch data D_LAT. The latch circuit 130 may transmit the latch data D_LAT to the data input/output line 200 outside the accumulator 100.

The accumulator 100 may perform an accumulation operation on the input data D_IN and the latch data D_LAT and use the accumulation data D_ACC generated by the accumulation operation as latch data D_LAT in the next accumulation operation. The next accumulation operation may be performed on the next input data D_IN and latch data D_LAT. The selector 120 may output the external data D_EXT as the selection data S_SEL before the addition operation in the accumulation adder 110 is performed, that is, before first input data D_IN is transmitted. Accordingly, before the accumulation operation in the accumulator 100 is performed, the external data D_EXT may be set as initial latch data D_LAT in the latch circuit 130. After the external data D_EXT is output from the latch circuit 130 as the latch data L_DAT, the selector 120 may output the accumulation data D_ACC from the accumulating adder 110 as the selection data S_SEL.

Figure 2:
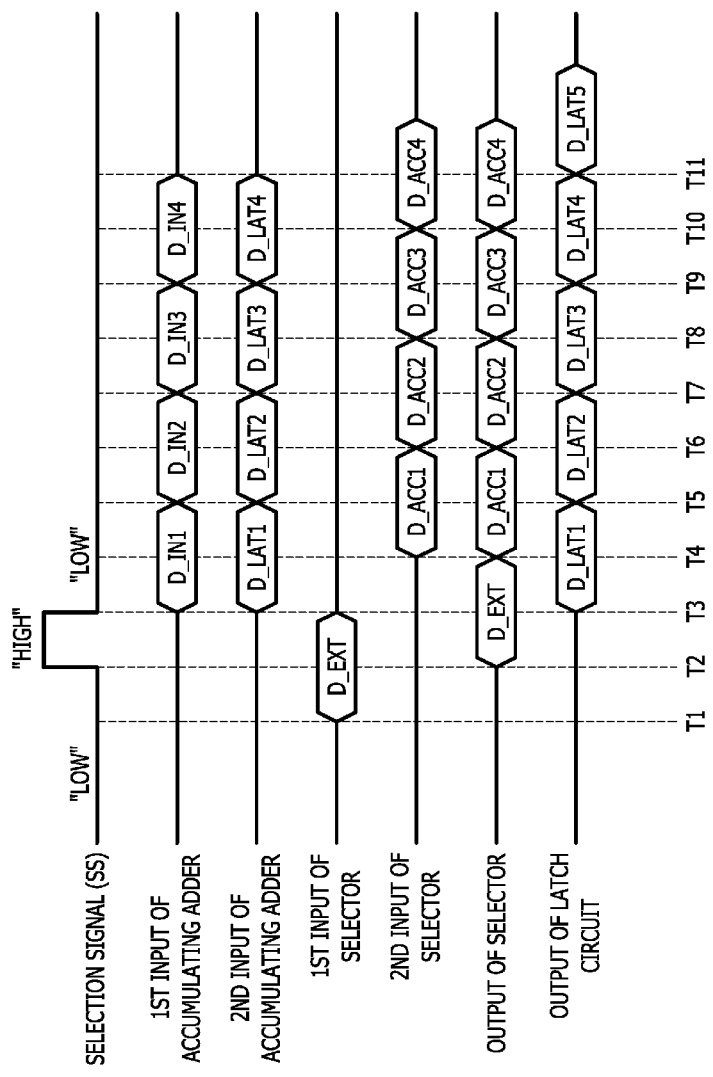
FIG. 2 is a timing diagram illustrating an accumulation operation process of the accumulator of FIG. 1.

FIG. 2 is a timing diagram illustrating an accumulation operation process of the accumulator 100 of FIG. 1. Referring to FIG. 2 together with FIG. 1, at a first time point T1, the external data D_EXT may start to be transmitted to the first input terminal IN1 of the selector 120. Because the first time point T1 is a time point before the input data D_IN is transmitted to the accumulator 100, data might not be input to the second input terminal IN2 of the selector 120. Because the selection signal SS is a logic "low" level LOW at the first time point T1, the selector 120 might not output data. When the logic level of the selection signal SS is changed from a logic "low" level LOW to a logic "high" level HIGH at a second time point T2, the selector 120 may transmit the external data D_EXT transmitted through the first input terminal IN1 through the output terminal OUT. Accordingly, at the second time point T2, the external data D_EXT may start to be transmitted from the selector 120 to the latch circuit 130.

The latch circuit 130 may latch the external data D_EXT to start to output the latched external data D_EXT as first latch data D_LAT1 at a third time point T3, and the first latch data D_LAT1 may start to be input to the accumulating adder 110. At the third time point T3, the first input data D_IN1 may also start to be input to the accumulating adder 110, and the accumulating adder 110 may start to perform an addition operation on the first input data D_IN1 and the first latch data D_LAT1. At a fourth time point T4, the accumulating adder 110 may start to output first accumulation data D_ACC1 as a result of the addition operation on the first input data D_IN1 and the first latch data D_LAT1. Because the first latch data D_LAT1 is the external data D_EXT, the first accumulation data D_ACC1 may be sum data of the external data D_EXT and the first input data D_IN1. Because the selection signal SS is at a logic "low" level LOW at the fourth time point T4, the selector 120 may start to output the first accumulation data D_ACC1 and transmit the same to the latch circuit 130.

The latch circuit 130 may latch the first accumulation data D_ACC1 to start to output the latched first accumulation data D_ACC1 as second latch data D_LAT2 at a fifth time point T5, and the second latch data D_LAT2 may start to be input to the accumulating adder 110. At the fifth time point T5, second input data D_IN2 may also start to be transmitted to the accumulating adder 110, and the accumulating adder 110 may perform an addition operation on the second input data D_IN2 and the second latch data D_LAT2. At a sixth time point T6, the accumulating adder 110 may start to output second accumulation data D_ACC2 as a result of the addition operation on the second input data D_IN2 and the second latch data D_LAT2. Because the second latch data D_LAT2 is sum data of the external data D_EXT and the first input data D_IN, the second accumulation data D_ACC2 may be sum data of the external data D_EXT, the first input data D_IN1, and the second input data D_IN2. Because the selection signal SS is at a logic "low" level low at the sixth time point T6, the selector 120 may start to output the second accumulation data D_ACC2 and transmit the same to the latch circuit 130.

The latch circuit 130 may latch the second accumulation data D_ACC2 to start to output the latched second accumulation data D_ACC2 as third latch data D_LAT3 at a seventh time point T7, and the third latch data D_LAT3 may start to be input to the accumulating adder 110. At the seventh time point T7, third input data D_IN3 may also start to be transmitted to the accumulating adder 110, and the accumulating adder 110 may perform an addition operation on the third input data D_IN3 and the third latch data D_LAT3. At an eighth time point T8, the accumulating adder 110 may start to output third accumulation data D_ACC3 as a result of the addition operation on the third input data D_IN3 and the third latch data D_LAT3. Because the third latch data D_LAT3 is sum data of the external data D_EXT, the first input data D_IN1, and the second input data D_IN2, the third accumulation data D_ACC3 may be sum data of the external data D_EXT and the first to third input data D_IN1-D_IN3. Because the selection signal SS is at a logic "low" level LOW at the eighth time point T8, the selector 120 may start to output the third accumulation data D_ACC3 and transmit the same to the latch circuit 130.

The latch circuit 130 may latch the third accumulation data D_ACC3 to start to output the latched third accumulation data D_ACC3 as fourth latch data D_LAT4 at a ninth time point T9, and the fourth latch data D_LAT3 may start to be input to the accumulating adder 110. At the ninth time point T9, fourth input data D_IN4 may also start to be transmitted to the accumulating adder 110, and the accumulating adder 110 may perform an addition operation on the fourth input data D_IN4 and the fourth latch data D_LAT4. At a tenth time point T10, the accumulating adder 110 may start to output fourth accumulation data D_ACC4 as a result of the addition operation on the fourth input data D_IN4 and the fourth latch data D_LAT4. Because the fourth latch data D_LAT4 is sum data of the external data D_EXT and the first to third input data D_IN1-D_IN3, the fourth accumulation data D_ACC4 may be sum data of the external data D_EXT and the first to fourth input data D_IN1-D_IN4. Because the selection signal SS is at a logic "low" level LOW at the tenth time point T10, the selector 120 may start to output the fourth accumulation data D_ACC4 and transmit the same to the latch circuit 130. The latch circuit 130 may latch the fourth accumulation data D_ACC4 to start to output the latched fourth accumulation data D_ACC4 as fifth latch data D_LAT5 at an eleventh time point T11. As the accumulation operation in the accumulator 100 is completed, the fifth latch data D_LAT5 output from the latch circuit 130 may be output from the accumulator 100 and transmitted to the data input/output line 200.

Figure 3:
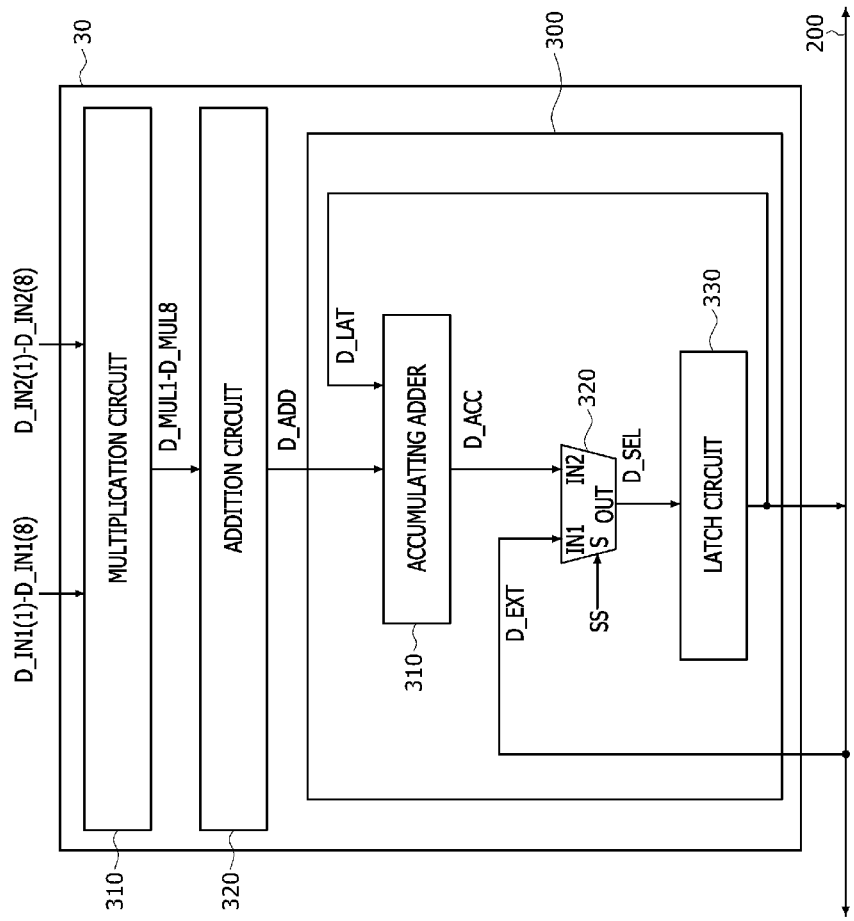
FIG. 3 is a diagram illustrating an operational logic circuit according to an embodiment of the present disclosure together with a data input/output line.
Figure 4:
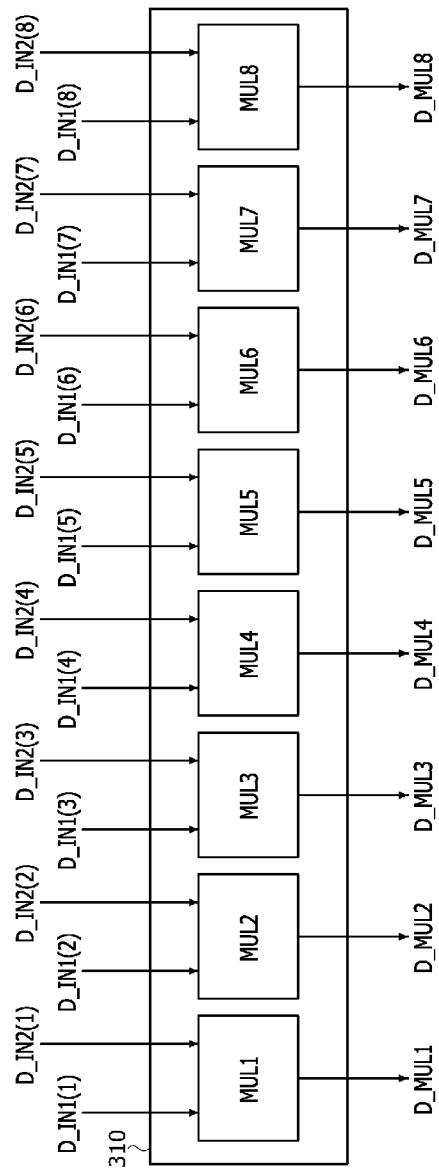
FIG. 4 is a diagram illustrating an example of a configuration of a multiplication circuit of the operational logic circuit of FIG. 3.
Figure 5:
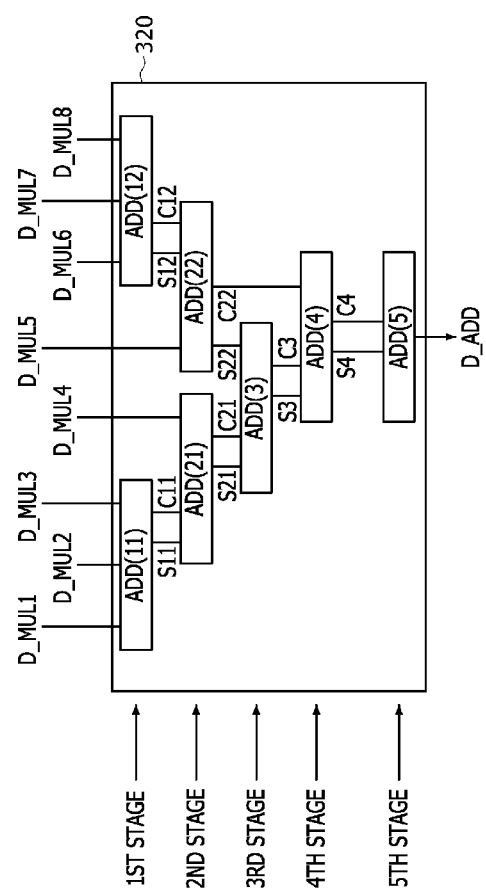
FIG. 5 is a diagram illustrating an example of a configuration of an addition circuit of the operational logic circuit of FIG. 3.

FIG. 3 is a diagram illustrating an operational logic circuit 30 according to an example of the present disclosure together with the data input/output line 200. FIG. 4 is a diagram illustrating an example of a configuration of a multiplication circuit 310 of the operational logic circuit 30 of FIG. 3. FIG. 5 is a diagram illustrating an example of a configuration of an addition circuit 320 of the operational logic circuit 30 of FIG. 3. In FIG. 3, the same reference numerals as those of FIG. 1 indicate the same components. Referring to FIG. 3, the operational logic circuit 30 may include the multiplication circuit 310, the addition circuit 320, and an accumulator 300.

The multiplication circuit 310 may perform a multiplication operation on first input data and second input data to output multiplication data. Hereinafter, a case in which the multiplication circuit 310 performs a multiplication operation on eight first input data and eight second input data will be exemplified. As shown in FIG. 4, the multiplication circuit 310 may perform multiplication operations on each of first to eighth-first input data D_IN1(1)-D_IN1(8) and each of first to eighth-second input data D_IN2(1)-D_IN2(8) to output first to eighth multiplication data D_MUL1-D_MUL8, respectively. The multiplication circuit 310 may include first to eighth multipliers MUL1-MUL8. Each of the first to eighth multipliers MUL1-MUL8 may receive one of the eight first input data D_IN1(1)-D_IN1(8) and one of the eight second input data D_IN1(1)-D_IN2(8).

As illustrated in the drawing, the first multiplier MUL1 may receive the primary first input data D_IN1(1) and the primary second input data D_IN2(1). The second multiplier MUL2 may receive the secondary first input data D_IN1(2) and the secondary second input data D_IN2(2). Similarly, the eighth multiplier MUL8 may receive the eighth-first input data D_IN1(8) and the eighth-second input data D_IN2(8). The first multiplier MUL1 may perform a multiplication operation on the primary first input data D_IN1(1) and the primary second input data D_IN2(1) to generate and output the first multiplication data D_MUL1. The second multiplier MUL2 may perform a multiplication operation on the secondary first input data D_IN1(2) and the secondary second input data D_IN2(2) to generate and output the second multiplication data D_MUL2. Similarly, the third to eighth multipliers MUL3-MUL8 may generate and output the third to eighth multiplication data D_MUL3-D_MUL8, respectively. The third to eighth multiplication data D_MUL3-D_MUL8 may be transmitted to the addition circuit 320.

Referring back to FIG. 3, the addition circuit 320 may add the first to eighth multiplication data D_MUL1-D_MUL8 output from the multiplication circuit 310 to generate and output addition data D_ADD. As shown in FIG. 5, the adder circuit 320 may be configured by arranging a plurality of, for example, seven adders ADD(11), ADD(12), ADD(21), ADD(22), ADD(3), ADD(4), ADD(5) in a hierarchical structure such as a tree structure. In this embodiment, the addition circuit 320 may include six full-adders and one half-adder. However, this is only an example, and the adder tree 320 may be variously configured with various combinations of full-adders and half-adders. As illustrated in the drawing, two full-adders ADD(11)-ADD(12) may be disposed in a first stage at a top of the addition circuit 320. Two full-adders ADD(21)-ADD(22) may also be disposed in a second stage of the next lower level in the addition circuit 320. One full-adder ADD(3) may be disposed in the next lower third stage in the addition circuit 320. One full-adder ADD(4) may also be disposed in the next lower fourth stage in the addition circuit 320. In addition, one half-adder ADD(5) may be disposed in a fifth stage of the lowermost level in the addition circuit 320.

The first full-adder ADD(11) of the first stage may perform an addition operation on the first to third multiplication data D_MUL1-D_MUL3 transmitted from the first to third multipliers MUL1-MUL3 of the multiplication circuit 310, respectively, to output addition data S11 and carry data C11. The second full-adder ADD(12) of the first stage may perform an addition operation on the sixth to eighth multiplication data D_MUL6-D_MUL8 transmitted from the sixth to eighth multipliers MUL6-MUL8 of the multiplication circuit 310, respectively, to output addition data S12 and carry data C12. The first full-adder ADD(21) of the second stage may perform an addition operation on the addition data S11 and the carry data C11 transmitted from the first full-adder ADD(11) of the first stage and the fourth multiplication data D_MUL4 transmitted from the fourth multiplier MUL4 of the multiplication circuit 310 to output addition data S21 and carry data C21. The second full-adder ADD(22) of the second stage may perform an addition operation on the addition data S12 and the carry data C12 transmitted from the second full-adder ADD(12) of the first stage and the fifth multiplication data D_MUL5 transmitted from the fifth multiplier MUL5 of the multiplication circuit 310 to output addition data S22 and carry data C22. The full-adder ADD(3) of the third stage may perform an addition operation on the addition data S21 and the carry data C21 transmitted from the first full-adder ADD(21) of the second stage and the addition data S22 transmitted from the second full-adder ADD(22) of the second stage to output addition data S3 and carry data C3. The full-adder ADD(4) of the fourth stage may perform an addition operation on the addition data S3 and the carry data C3 transmitted from the full-adder ADD(3) of the third stage and the carry data C22 transmitted from the second full-adder ADD(22) of the second stage to output addition data S4 and carry data C4. The half-adder ADD(5) of the fifth stage may perform an addition operation on the addition data S4 and the carry data C4 transmitted from the full-adder ADD(4) of the fourth stage and output result data as addition data D_ADD.

Referring back to FIG. 3, the addition data D_ADD output from the addition circuit 320 may be transmitted to the accumulator 300. The accumulator 300 may include an accumulating adder 310, a selector 320, and a latch circuit 330. The accumulator 300 may have the same configuration as the accumulator 100 described with reference to FIG. 1. Accordingly, the description for the accumulating adder 110, the selector 120, and the latch circuit 130 constituting the accumulator 100 may be equally applied to the accumulating adder 310, the selector 320, and the latch circuit 330. In this case, the accumulating adder 310 may receive the addition data D_ADD output from the addition circuit 320 as input data (D_IN in FIG. 1). In addition, the external data D_EXT transmitted to the first input terminal IN1 of the selector 320 may be operation result data output from another operational logic circuit.

Figure 6:
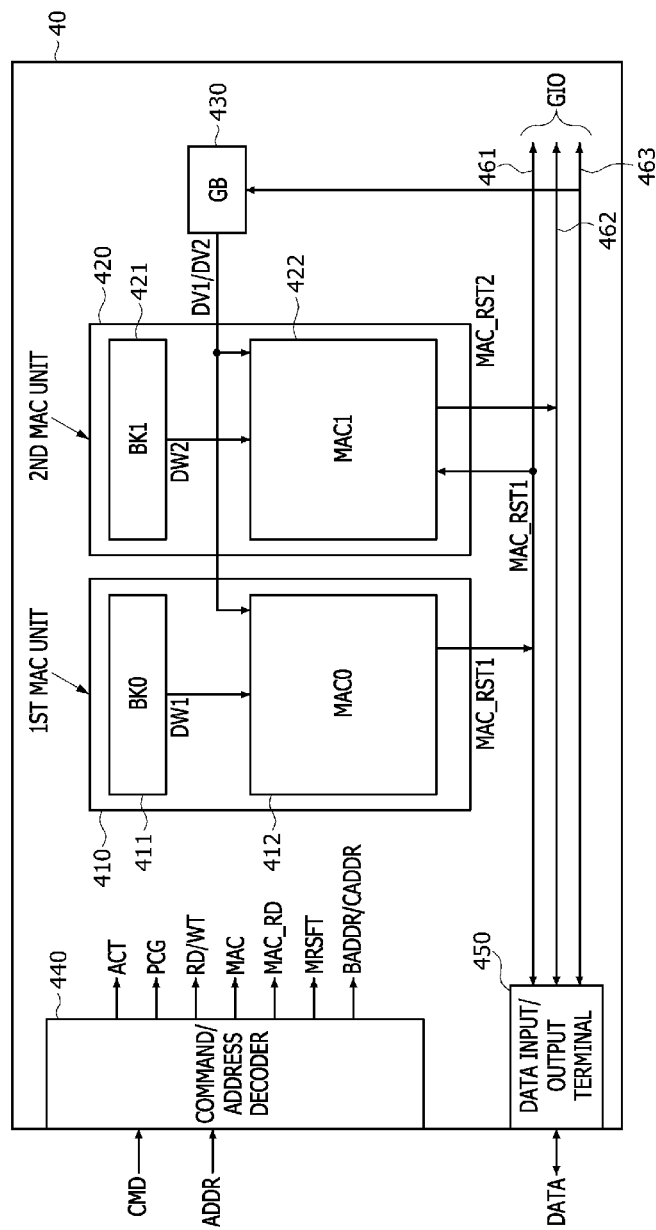
FIG. 6 is a diagram illustrating a PIM device according to an embodiment of the present disclosure.

FIG. 6 is a diagram illustrating a PIM device 40 according to an embodiment of the present disclosure. Although the PIM device 40 according to the present embodiment may perform various operations including an accumulation operation, a case in which a multiplication and accumulation (hereinafter, referred to as "MAC") operation is performed will be taken as an example. Accordingly, in this example, the terms "operation logic unit" and "operation" will be replaced with "MAC unit" and "MAC operation", respectively. Referring to FIG. 6, the PIM device 40 may include a first MAC unit 410, a second MAC unit 420, a buffer memory (GB) 430, a command/address decoder 440, a data input/output terminal 450, and a data input/output lines (GIO) 461, 462, and 463.

The first MAC unit 410 may include a first memory circuit, for example, a first memory bank (BK0) 411 and a first MAC operator (MAC0) 412. The first MAC unit 410 may perform a first MAC operation to generate and output first MAC result data MAC_RST1. To this end, the first memory bank 411 may store a first set DW1 of weight data and provide the stored first set DW1 of the weight data to the first MAC operator 412. The first MAC operator 412 may receive the first set DW1 of the weight data and a first set DV1 of vector data from the first memory bank 411 and the buffer memory 430, respectively. The first MAC operator 412 may perform a first MAC operation on the first set DW1 of the weight data and the first set DV1 of the vector data to generate the first MAC result data MAC_RST1. The first MAC operator 412 may transmit the generated first MAC result data MAC_RST1 to the first data input/output line 461.

The second MAC unit 420 may include a second memory circuit, for example, a second memory bank (BK1) 421 and a second MAC operator (MAC1) 422. The second MAC unit 420 may perform a second MAC operation to generate and output second MAC result data MAC_RST2. To this end, the second memory bank 421 may store a second set DW2 of the weight data and provide the stored second set DW2 of the weight data to the second MAC operator 422. The second MAC operator 422 may receive the second set DW2 of the weight data and a second set DV2 of the vector data from the second memory bank 421 and the buffer memory 430, respectively. The second MAC operator 422 may perform a second MAC operation on the second set DW2 of the weight data and the second set DV2 of the vector data to generate the second MAC result data MAC_RST2. The second MAC operator 422 may receive the first MAC result data MAC_RST1 output from the first MAC unit 410 through the first data input/output line 461. The second MAC operator 422 may perform the second MAC operation using the first MAC result data MAC_RST1 as initial latch data. The second MAC operator 422 may transmit the generated second MAC result data MAC_RST2 to the second data input/output line 462.

The buffer memory 430 may store the first set DV1 and the second set DV2 of the vector data. To this end, the buffer memory 430 may store the vector data transmitted from outside of the PIM device 40, for example, a host or a controller through the third data input/output line 463. The buffer memory 430 may provide the stored first set DV1 and second set DV2 of the vector data to the first MAC operator 412 and the second MAC operator 422. The buffer memory 430 may provide the first set DV1 of the vector data to the first MAC operator 412 and the second MAC operator 422 so that the first MAC operation in the first MAC unit 410 is performed. In addition, the buffer memory 430 may provide the second set DV2 of the vector data to the first MAC operator 412 and the second MAC operator 422 so that the second MAC operation in the second MAC unit 420 is performed.

The command/address decoder 440 may decode the command CMD and address signal ADDR transmitted from outside to generate and output control signals for controlling various operations in the PIM device 40. In an example, the command/address decoder 440 may decode the command CMD from outside to generate and output an active control signal ACT, a precharge control signal PCG, a read/write control signal RD/WT, a MAC operation control signal MAC, a MAC result read control signal MAC_RD, and a MAC result shift control signal MRSFT. The command/address decoder 440 may decode the address signal ADDR from outside to output a bank address/column address BADDR/CADDR. The active control signal ACT, the precharge control signal PCG, the read/write control signal RD/WT, and the bank address/column address BADDR/CADDR may be transmitted to the first memory bank 411 and the second memory bank 421. The MAC operation control signal MAC, the MAC result read control signal MAC_RD, and the MAC result shift control signal MRSFT may be transmitted to the first MAC operator 412 and the second MAC operator 422. The write control signal WT and the column address CADDR may be transmitted to the buffer memory 430.

The active control signal ACT may control a row activation operation on the first memory bank 411 and the second memory bank 421. The precharge control signal PCG may control a row precharge operation on the first memory bank 411 and the second memory bank 421. The read control signal RD may control a read operation of reading read data from the first memory bank 411 or the second memory bank 421. The write control signal WT may control a write operation of writing write data in the first memory bank 411, the second memory bank 421, or the buffer memory 430. By the write control signal WT, the first memory bank 411 or the second memory bank 421 may store the weight data transmitted from outside. In addition, by the write control signal WT, the buffer memory 430 may store the vector data transmitted from outside. The MAC operation control signal MAC may control a MAC operation of the first MAC operator 412 and/or the second MAC operator 422. The MAC result read control signal MAC_RD may control a read operation on the MAC result data of the first MAC operator 412 and/or the second MAC operator 422. The MAC result shift control signal MRSFT may control a shifting operation of the first MAC result data from the first MAC operator 412 to the second MAC operator 422. The bank address BADDR may control an operation of selecting a memory bank. The column address CADDR may designate data storage locations in the first memory bank 411, the second memory bank 421, and the buffer memory 430.

The data input/output terminal 450 may be provided as a data communication means between the PIM device 40 and the outside. Accordingly, the PIM device 40 may receive data from the outside through the data input/output terminal 450 or transmit data to the outside. The data input/output terminal 450 may be coupled to the first MAC unit 410, the second MAC unit 420, and the buffer memory 430 through the first to third data input/output lines 461, 462, and 463, respectively. Although not shown in the drawings, the first memory bank 411 and the second memory bank 421 may receive or transmit data through the first data input/output line 461 and the second data input/output line 462, respectively. The first MAC operator 412 may transmit the first MAC result data MAC_RST1 to the second MAC operator 422 through the first data input/output line 461. The second MAC operator 422 may transmit the second MAC result data MAC_RST2 to the second data input/output line 462. The buffer memory 430 may receive the vector data through the third data input/output line 463. In this example, the first to third data input/output lines 461, 462, and 463 are divided, but this is merely for convenience of description and the first to third data input/output lines 461, 462, and 463 may be replaced with single data input/output line.

Figure 7:
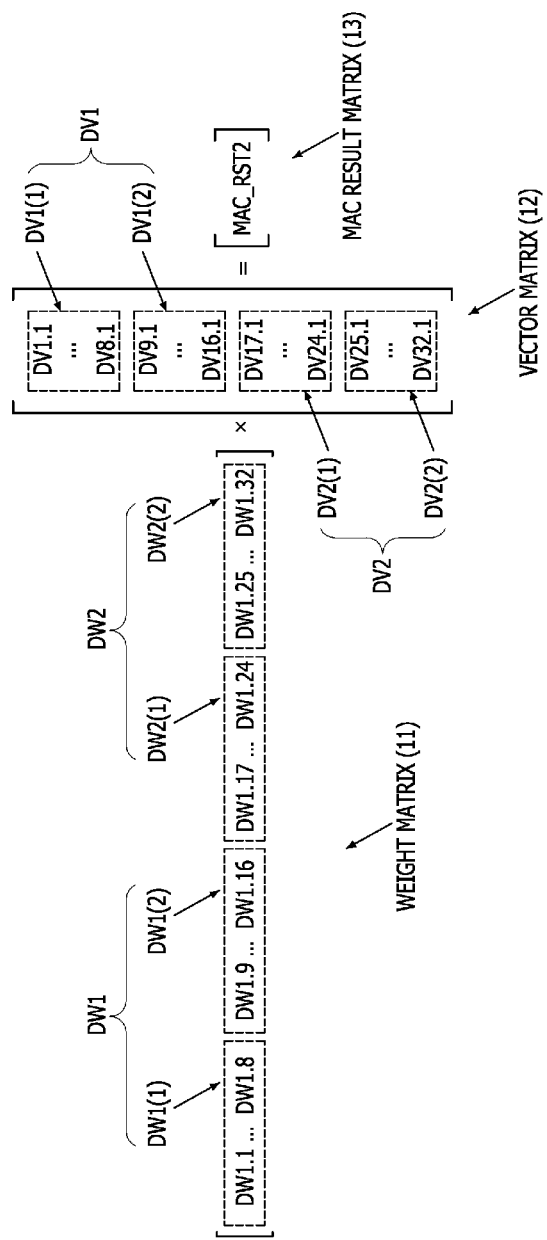
FIG. 7 is a diagram illustrating an example of a MAC operation performed in the PIM device of FIG. 6.

FIG. 7 is a diagram illustrating an example of a MAC operation performed in the PIM device 40 of FIG. 6. The PIM device 40 may perform a MAC operation of performing matrix multiplication on a weight matrix and a vector matrix and generating a MAC result matrix as a result of the matrix multiplication. The weight matrix may have an M×N matrix format having weight data as elements. The vector matrix may have an N×1 matrix format having vector data as elements. The MAC result matrix may have an M×1 matrix format having the MAC result data as an element. In this example, a case in which "M" and "N" are "1" and "32", respectively, will be taken as an example.

Referring to FIG. 7 together with FIG. 6, the 1×32 weight matrix 11 may have 32 pieces of weight data DW1.1-DW1.32 arranged in one row as elements. The 32×1 vector matrix 12 may have 32 pieces of vector data DV1.1-DV32.1 arranged in one column as elements. The MAC result matrix 13 may have one piece of MAC result data MAC_RST2 as an element. As described with reference to FIG. 6, weight data DW1.1-DW1.32 may be divided and stored in the first memory bank 411 and the second memory bank 421. For example, the first set DW1 of the weight data DW1.1-DW1.32, that is, the weight data DW1.1-DW1.16 of a first column to a sixteenth column may be stored in the first memory bank 411. The second set DW2 of the weight data DW1.1-DW1.32, that is, the weight data DW1.17-DW1.32 of a $17^{th}$ column to a $32^{nd}$ column may be stored in the second memory bank 421. The vector data DV1.1-DV32.1 may be stored in the buffer memory 430.

The first set DW1 of the weight data DW1.1-DW1.32 may include a first group DW1(1) and a second group DW1(2) of the first set DW1. The first group DW1(1) of the first set DW1 may be composed of the weight data DW1.1-DW1.8 of the first column to the eighth column. The second group DW1(2) of the first set DW1 may be composed of the weight data DW1.9-DW1.16 of the ninth column to the sixteenth column. The second set DW2 of the weight data DW1.1-DW1.32 may include a first group DW2(1) and a second group DW2(2) of the second set DW2. The first group DW2(1) of the second set DW2 may be composed of the weight data DW1.17-DW1.24 of the $17^{th}$ column to the $24^{th}$ column. The second group DW2(2) of the second set DW2 may be composed of the weight data DW1.25-DW1.32 of the $25^{th}$ column to the $32^{nd}$ column. The vector data DV1.1-DV32.1 may be divided into a first set DV1 and a second set DV2. The first set DV1 of the vector data DV1.1-DV32.1 may include a first group DV1(1) and a second group DV1(2) of the first set DV1. The first group DV1(1) of the first set DV1 may be composed of the vector data DV1.1-DV8.1 of the first row to the eighth row. The second group DV1(2) of the first set DV1 may include the vector data DV9.1-DV16.1 of the ninth row to the sixteenth row. The second set DV2 of the vector data DV1.1-DV32.1 may include a first group DV2(1) and a second group DV2(2) of the second set DV2. The first group DV2(1) of the second set DV2 may be composed of the vector data DV17.1-DV24.1 of the $17^{th}$ row to the $24^{th}$ row. The second group DV2(2) of the second set DV2 may be composed of the vector data DV25.1-DV32.1 of the $25^{th}$ row to the $32^{nd}$ row.

Because the MAC operation in the PIM device 40 is performed as a matrix operation on the weight matrix 11 and the vector matrix 12, the MAC result data MAC_RST2 may be generated by performing multiplication operations on each of the weight data DW1.1-DW1.32 and each of the vector data DV1.1-DV32.1 and summing all multiplication data DW1.1×DV1.1, DW1.2×DV2.1, . . . , and DW1.32×DV32.1 generated as a result of the multiplication operation. The MAC operation may include a first MAC operation on the first set DW1 of the weight data and the first set DV1 of the vector data, and a second MAC operation on the second set DW2 of the weight data and the second set DV2 of the vector data. The first MAC operation may include a first operation on the first group DW1(1) of the first set DW1 of the weight data and the first group DV1(1) of the first set DV1 of the vector data, and a second operation on the second group DW1(2) of the first set DW1 of the weight data and the second group DV1(2) of the first set DV1 of the vector data. The second MAC operation may also include a first operation on the first group DW2(1) of the second set DW2 of the weight data and the first group DV2(1) of the second set DV2 of the vector data, and a second operation on the second group DW2(2) of the second set DW2 of the weight data and the second group DV2(2) of the second set DV2 of the vector data.

The result data (DW1.1×DV1.1)+ . . . +(DW1.8×DV8.1) generated as a result of the first operation of the first MAC operation may be accumulatively added to the result data (DW1.9×DV9.1)+ . . . +(DW1.16×DV16.1) generated as a result of the second operation of the first MAC operation. The result data (DW1.1×DV1.1)+ . . . +(DW1.8×DV8.1) generated as a result of the accumulative addition may be accumulatively added to the result data (DW1.17×DV17.1)+ . . . +(DW1.24×DV24.1) generated as a result of the first operation of the second MAC operation. The result data (DW1.1×DV1.1)+ . . . +(DW1.24×DV24.1) generated as a result of the finally accumulative addition may be added to the result data (DW1.25×DV25.1)+ . . . +(DW1.32×DV32.1) generated as a result of the second operation of the second MAC operation. As a result, "(DW1.1×DV1.1)+ . . . +(DW1.32×DV32.1)" may be generated as a final result data MAC_RST2.

Figure 8:
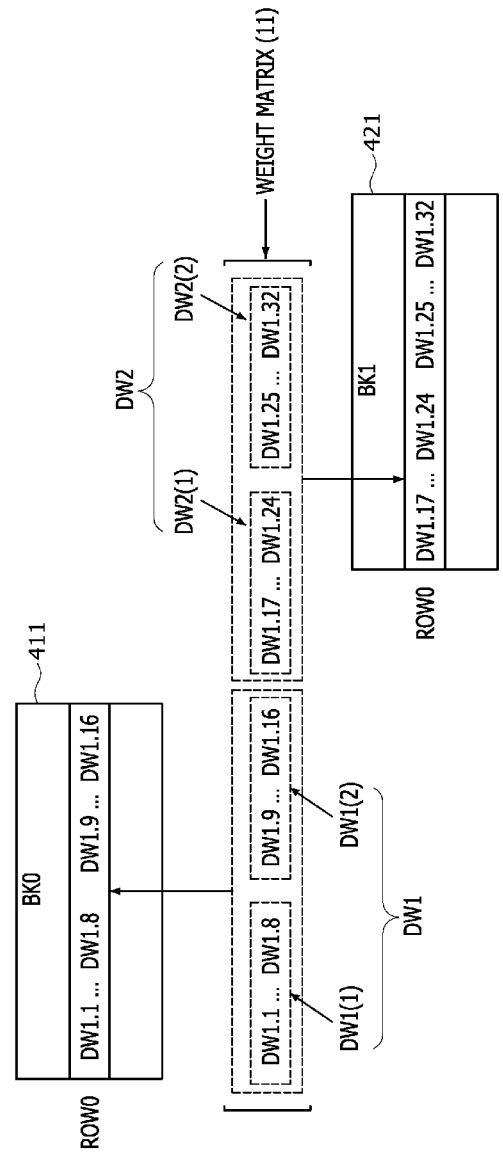
FIG. 8 is a diagram illustrating an example of a method in which a first memory bank and a second memory bank of the PIM device of FIG. 6 store weight data of FIG. 7.

FIG. 8 is a diagram illustrating an example of a method in which the first memory bank 411 and the second memory bank 421 of the PIM device 40 of FIG. 6 store the weight data DW1.1-DW1.32 of FIG. 7. In this example, it is assumed that the first memory bank 411 and the second memory bank 421 have the same page size, and the data size of the weight data DW1.1-W1.32 of the weight matrix 11 is larger than the page size. Referring to FIG. 8, the first set DW1.1-DW1.16 of the weight data DW1.1-W1.32 of the weight matrix 11 may be stored in the first memory bank BK0. The second set DW1.17-DW1.32 of the weight data DW1.1-W1.32 of the weight matrix 11 may be stored in the second memory bank BK1. In a case where the first set DW1.1-DW1.16 of the weight data DW1.1-W1.32 is store in a row ROW0 designated by a first row address among the rows of the first memory bank 411, the second set DW1.17-DW1.32 may be stored in a ROW0 designated by the first row address among the rows of the second memory bank BK1. Accordingly, when the active control signal (ACT in FIG. 6) and the precharge control signal (PCG in FIG. 6) along with the first row address are transmitted to the first memory bank 411 and the second memory bank 421, the row ROW0 of each of the first memory bank 411 and the second memory bank 421 may be activated and precharged together.

Figure 9:
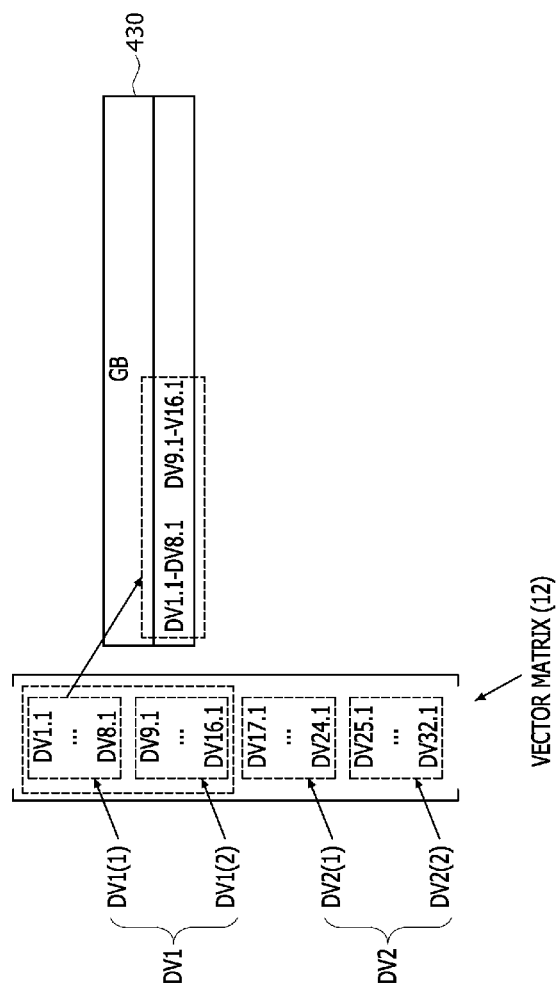
FIGS. 9 and 10 are diagrams illustrating an example of a method in which a buffer memory of the PIM device of FIG. 6 stores vector data of FIG. 7.
Figure 10:
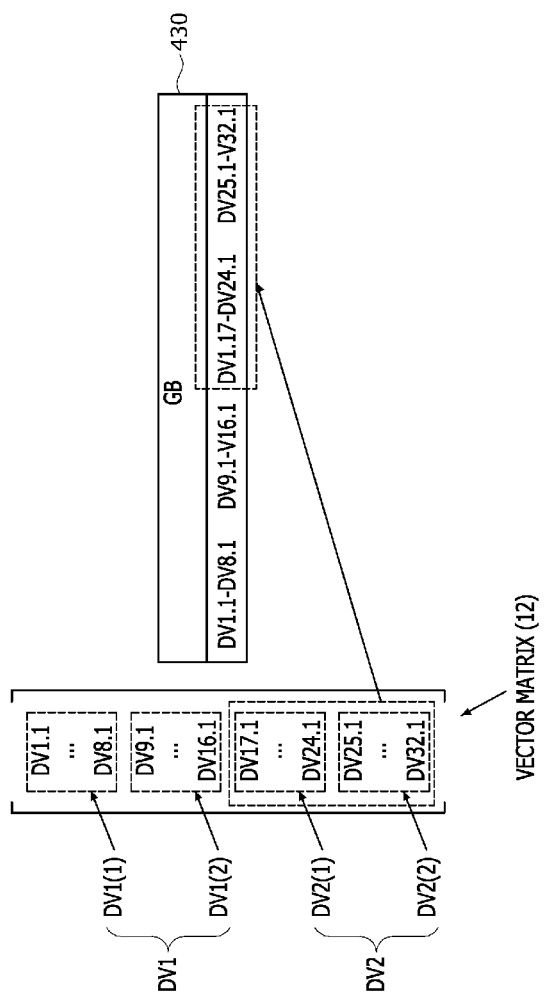

FIGS. 9 and 10 are diagrams illustrating an example of a method in which the buffer memory 430 of the PIM device 40 of FIG. 6 stores the vector data DV1.1-DV32.1 of FIG. 7. Referring to FIG. 9, the first set DV1.1-DV16.1 of the vector data DV1.1-DV32.1 constituting the vector matrix 12 may be stored in a first region and a second region of the buffer memory 430. The first region and the second region of the buffer memory 430 may be designated by a first column address and a second column address, respectively. A first group (DV1.1-DV8.1) DV1(1) of the first set DV1.1-DV16.1 of the vector data DV1.1-DV32.1 may be stored in the first region designated by the first column address. A second group (DV9.1-DV16.1) DV1(2) of the first set DV1.1-DV16.1 of the vector data DV1.1-DV32.1 may be stored in the second region designated by the second column address. Here, the first column address may be the same as the column address of columns of the first memory bank 411 in which the first group (DW1.1-DW1.8) DW1(1) of the first set DW1.1-DW1.16 of the weight data DW1.1-W1.32 is stored. In addition, the second column address may be the same as the column address of the columns of the first memory bank 411 in which the second group (DW1.9-DW1.16) DW1(2) of the first set DW1.1-DW1.16 of the weight data DW1.1-W1.32 is stored.

When the first column address is transmitted to the first memory bank 411 and the buffer memory 430 along with the MAC operation control signal MAC, the first memory bank 411 may provide the first group DW1.1-DW1.8 of the first set DW1.1-DW1.16 of the weight data DW1.1-W1.32 to the first MAC operator 412. The buffer memory 430 may provide the first group DV1.1-DV8.1 of the first set DV1.1-DV16.1 of the vector data DV1.1-DV32.1 to the first MAC operator 412 and the second MAC operator 422. Similarly, when the second column address is transmitted to the first memory bank 411 and the buffer memory 430 along with the MAC operation control signal MAC, the first memory bank 411 may provide the second group DW1.9-DW1.16 of the first set DW1.1-DW1.16 of the weight data DW1.1-W1.32 to the first MAC operator 412. The buffer memory 430 may provide the second group DV9.1-DV16.1 of the first set DV1.1-DV16.1 of the vector data DV1.1-DV32.1 to the first MAC operator 412 and the second MAC operator 422.

Next, referring to FIG. 10, the second set DV17.1-DV32.1 of the vector data DV1.1-DV32.1 constituting the vector matrix 12 may be stored in a third region and a fourth region of the buffer memory 430. The third region and the fourth region of the buffer memory 430 may be designated by a third column address and a fourth column address, respectively. A first group (DV17.1-DV24.1) DV2(1) of the second set DV17.1-DV32.1 of the vector data DV1.1-DV32.1 may be stored in the third region designated by the third column address. A second group (DV25.1-DV32.1) DV2(2) of the second set DV17.1-DV32.1 of the vector data DV1.1-DV32.1 may be stored in the fourth region designated by the fourth column address. Here, the third column address may be the same as the column address of columns of the second memory bank 421 in which the first group (DW1.17-DW1.24) DW2(1) of the second set DW1.17-DW1.32 of the weight data DW1.1-W1.32 is stored. In addition, the fourth column address may be the same as the column address of columns of the second memory bank 421 in which the second group DW1.25-DW1.32 (DW2(2)) of the second set DW1.17-DW1.32 of the weight data DW1.1-W1.32 is stored.

When the third column address is transmitted to the second memory bank 421 and the buffer memory 430 along with the MAC operation control signal MAC, the second memory bank 421 may provide the first group DW1.17-DW1.24 of the second set DW1.17-DW1.32 of the weight data DW1.1-W1.32 to the second MAC operator 422. The buffer memory 430 may provide the first group DV17.1-DV24.1 of the second set DV17.1-DV32.1 of the vector data DV1.1-DV32.1 to the first MAC operator 412 and the second MAC operator 422. Similarly, when the fourth column address is transmitted to the second memory bank 421 and the buffer memory 430 along with the MAC operation control signal MAC, the second memory bank 421 may provide the second group DW1.25-DW1.32 of the second set DW1.17-DW1.32 of the weight data DW1.1-W1.32 to the second MAC operator 422. The buffer memory 430 may provide the second group DV25.1-DV32.1 of the second set DV17.1-DV32.1 of the vector data DV1.1-DV32.1 to the first MAC operator 412 and the second MAC operator 422.

Figure 11:
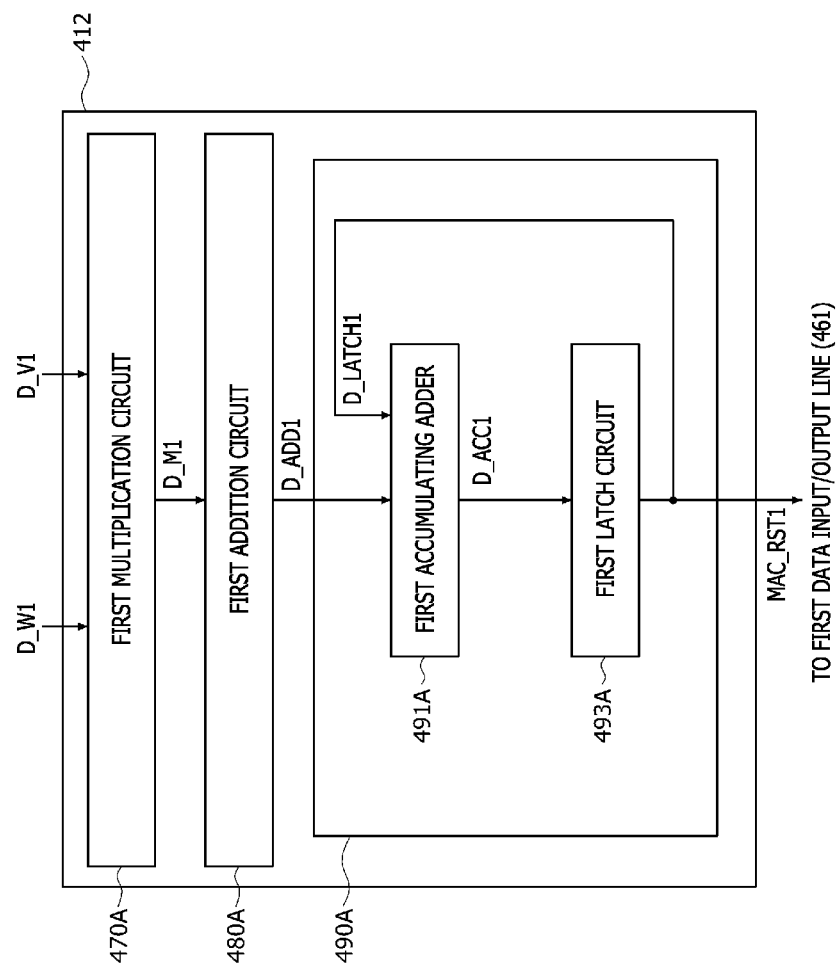
FIG. 11 is a diagram illustrating an example of a configuration of a first MAC operator of the PIM device of FIG. 6.

FIG. 11 is a diagram illustrating an example of a configuration of the first MAC operator 412 of the PIM device 40 of FIG. 6. Referring to FIG. 11, the first MAC operator 412 may include a first multiplication circuit 470A, a first addition circuit 480A, and a first accumulator 490A. The first multiplication circuit 470A may receive first weight data D_W1 and first vector data D_V1 from the first memory bank 411 and the buffer memory 430, respectively. The first multiplication circuit 470A may perform a multiplication operation on the first weight data D_W1 and the first vector data D_V1 to generate and output first multiplication data D_M1 as a result of the multiplication operation. The first multiplication circuit 470A may have the same configuration as the multiplication circuit 310 described with reference to FIG. 4.

The first addition circuit 480A may perform an addition operation on the first multiplication data D_M1 output from the first multiplication circuit 470A to generate and output first addition data D_ADD1 as a result of the addition operation. The first addition circuit 480A may have the same configuration as the addition circuit 320 described with reference to FIG. 5. The first accumulator 490A may include a first accumulating adder 491A and a first latch circuit 493A. The first accumulating adder 491A may perform an accumulation operation of adding the first addition data D_ADD1 output from the first addition circuit 480A to first latch data D_LATCH1 to generate and output first accumulation data D_ACC1 as a result of the accumulation operation. The first latch circuit 493A may latch the first accumulation data D_ACC1 output from the first accumulating adder 491A to output latched first accumulation data D_ACC1 as the first latch data D_LATCH1. When the MAC operation in the first MAC operator 412 is completed, the first latch data D_LATCH1 may be transmitted to the first data input/output line 461 as first MAC result data MAC_RST1.

Figure 12:
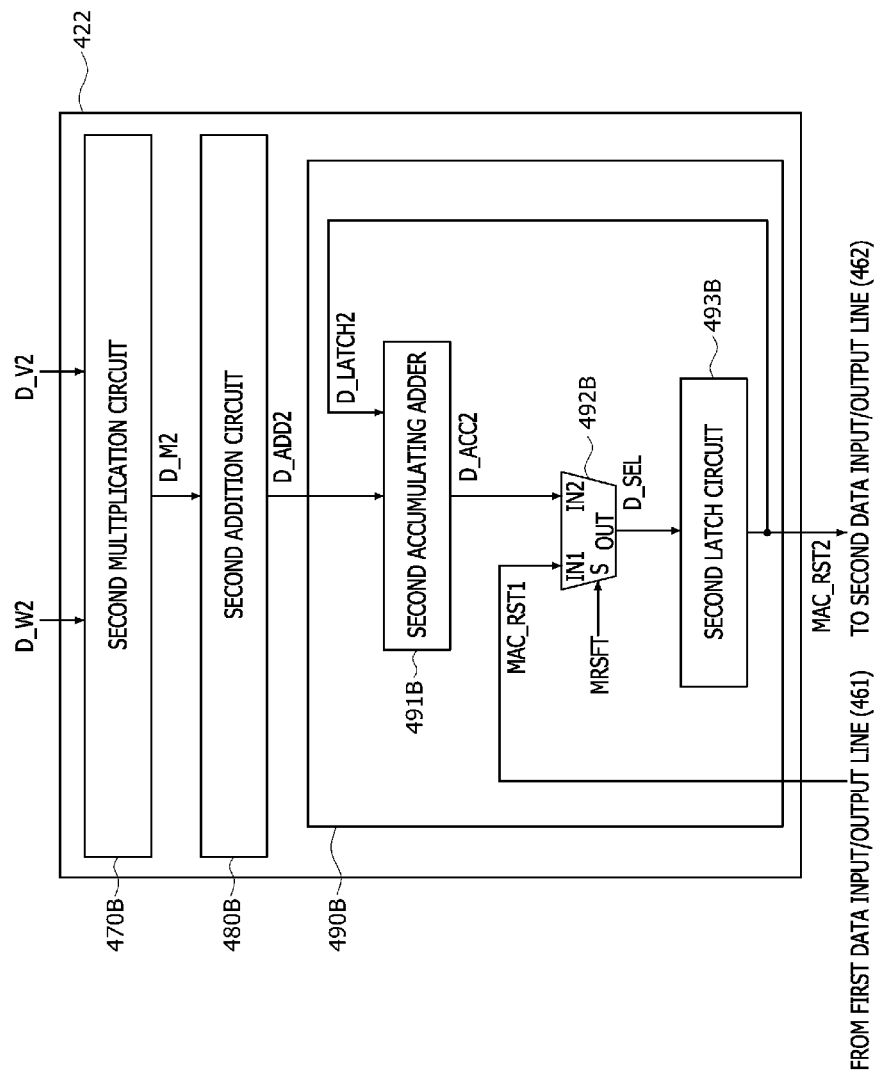
FIG. 12 is a diagram illustrating an example of a configuration of a second MAC operator of the PIM device of FIG. 6.

FIG. 12 is a diagram illustrating an example of a configuration of the second MAC operator 422 of the PIM device 40 of FIG. 6. Referring to FIG. 12, the second MAC operator 422 may include a second multiplication circuit 470B, a second addition circuit 480B, and a second accumulator 490B. The second multiplication circuit 470B may receive second weight data D_W2 and second vector data D_V2 from the second memory bank 421 and the buffer memory 430, respectively. The second multiplication circuit 470B may perform a multiplication operation on the second weight data D_W2 and the second vector data D_V2 to generate and output second multiplication data D_M2 as a result of the multiplication operation. The second multiplication circuit 470B may have the same configuration as the multiplication circuit 310 described with reference to FIG. 4. The second addition circuit 480B may perform an addition operation on the second multiplication data D_M2 output from the second multiplication circuit 470B to generate and output second addition data D_ADD2 as a result of the addition operation. The second addition circuit 480B may have the same configuration as the addition circuit 320 described with reference to FIG. 5.

The second accumulator 490B may include a second accumulating adder 491B, a selector 492B, and a second latch circuit 493B. The second accumulating adder 491B may perform an accumulation operation of adding the second addition data D_ADD2 output from the second addition circuit 480B to second latch data D_LATCH2 to generate and output second accumulation data D_ACC2 as a result of the accumulation operation. The selector 492B may input the first MAC result data MAC_RST1 transmitted through the first data input/output line 461 to the second latch circuit 493B as selection data D_SEL in response to a first logic level, for example, a logic "high" signal of the MAC result shift control signal MRSFT described with reference to FIG. 6. The selector 492B may input the second accumulation data D_ACC2 transmitted from the second accumulating adder 491B to the second latch circuit 493B as selection data D_SEL in response to a second logic level, for example, a logic "low" signal of the MAC result shift control signal MRSFT. In an example, a logic level of the MAC result shift control signal MRSFT may be changed from the first logic level to the second logic level at a time point when the MAC operation control signal (MAC of FIG. 6) is transmitted. The second latch circuit 493B may latch the selection data D_SEL output from the selector 492B as the second latch data D_LATCH2. The second latch data D_LATCH2 may be fed back to the second accumulating adder 491B. When the MAC operation in the second MAC operator 422 is completed, the second latch data D_LATCH2 may be transmitted as second MAC result data MAC_RST2 to the second data input/output line 462. The second accumulator 490B may have the same configuration as the accumulator 100 described with reference to FIG. 1.

Figure 13:
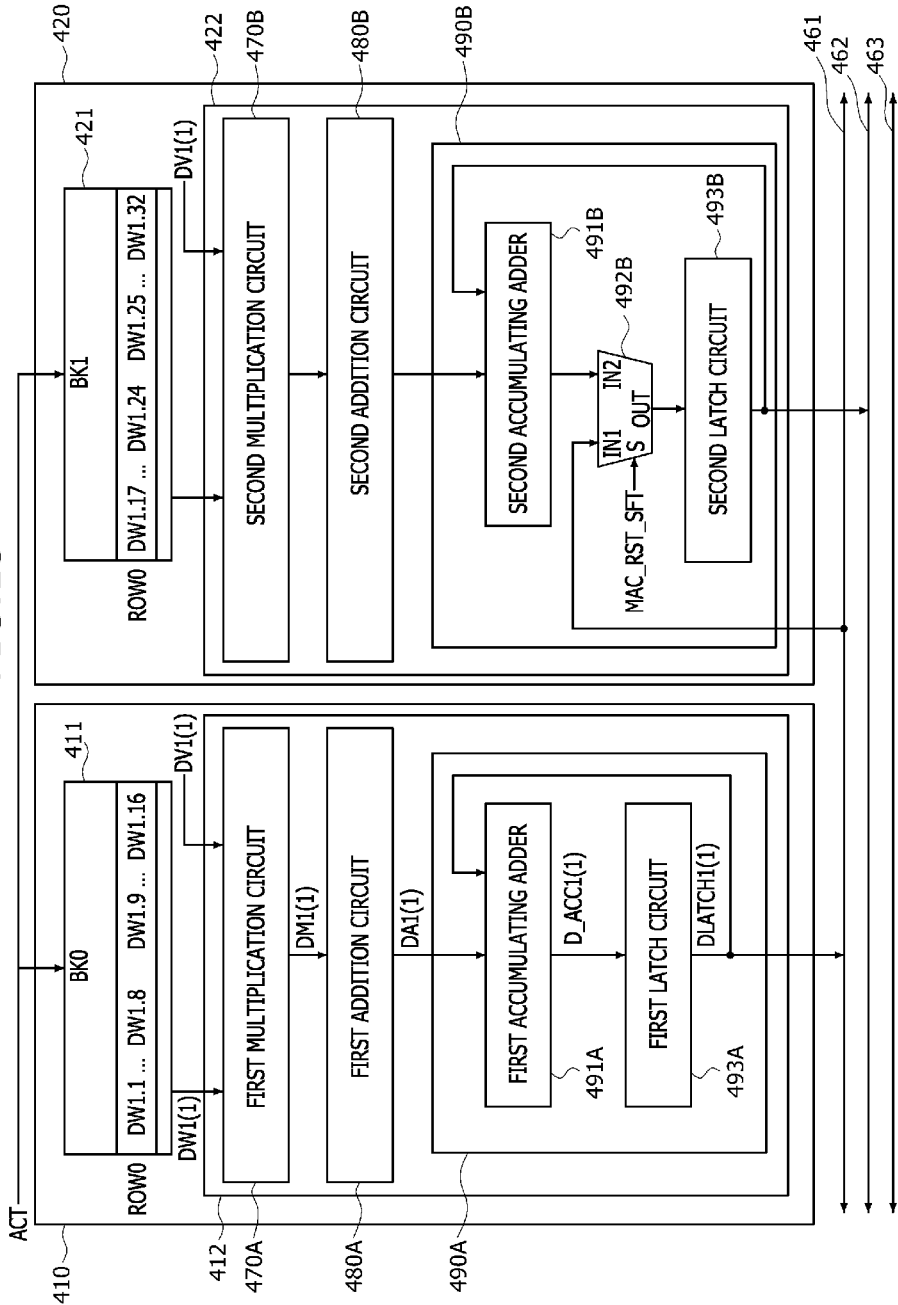
FIGS. 13, 14, 15, 16, and 17 are diagrams illustrating an operation process in which the PIM device of FIG. 6 performs a MAC operation according to a matrix operation of FIG. 7.
Figure 14:
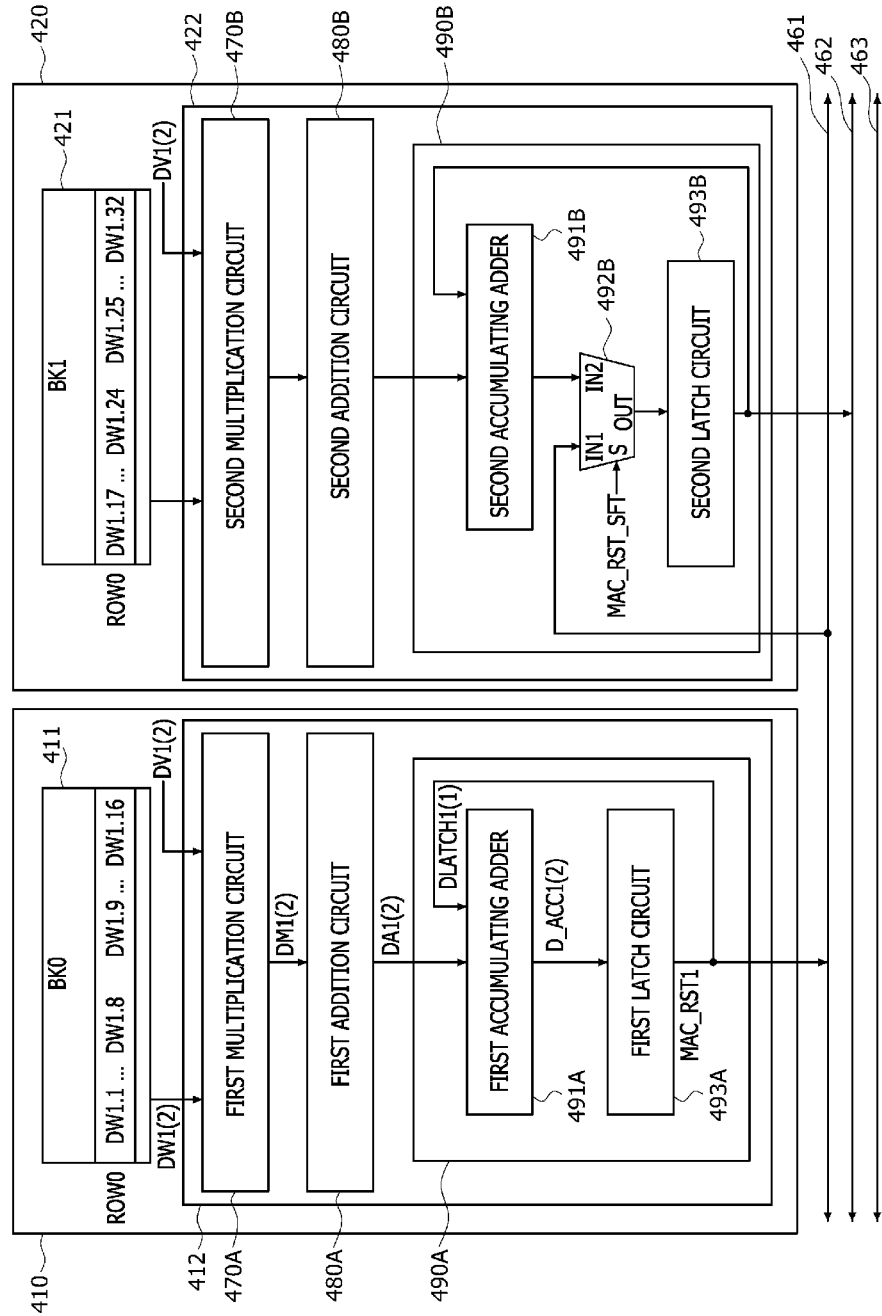
Figure 15:
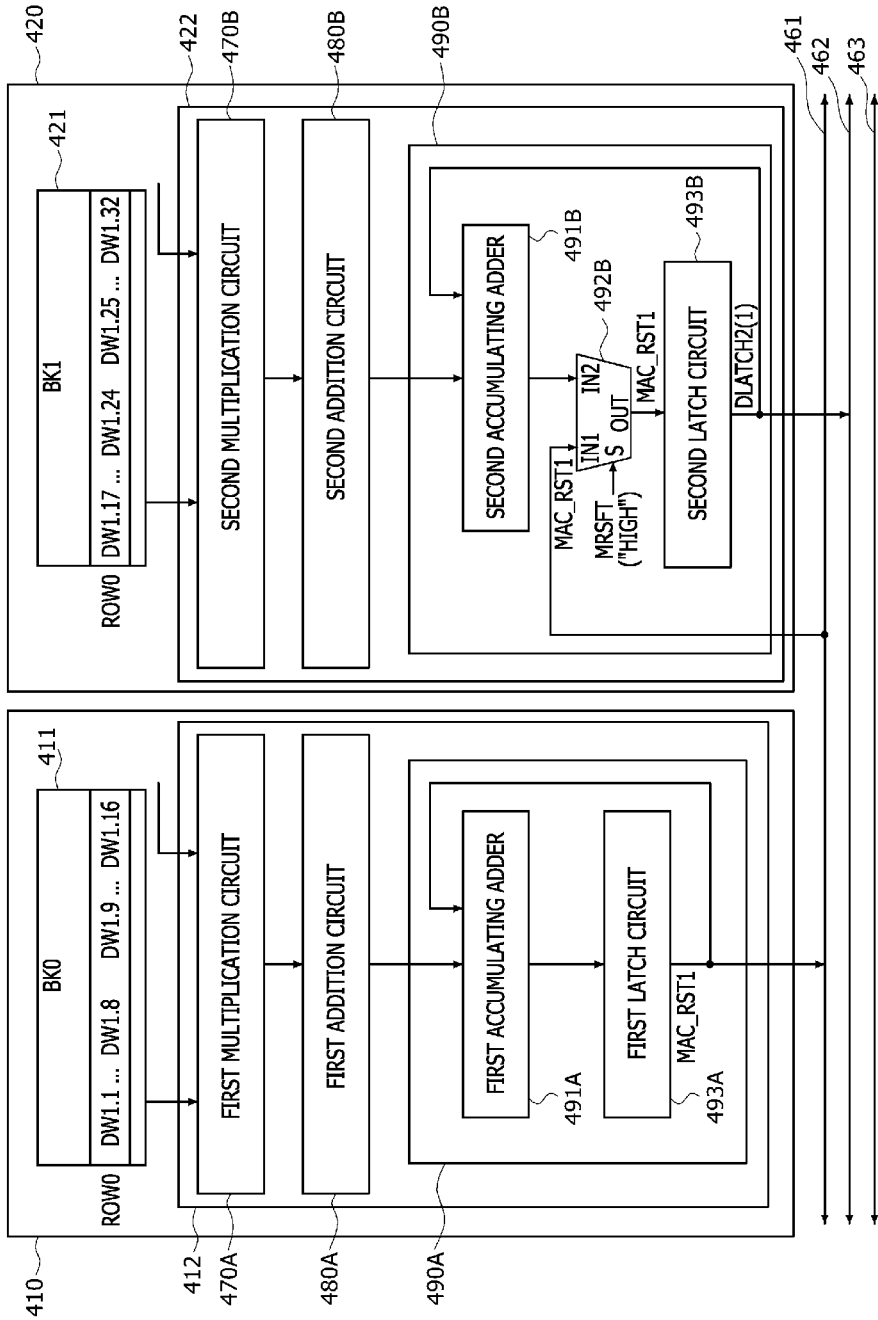
Figure 16:
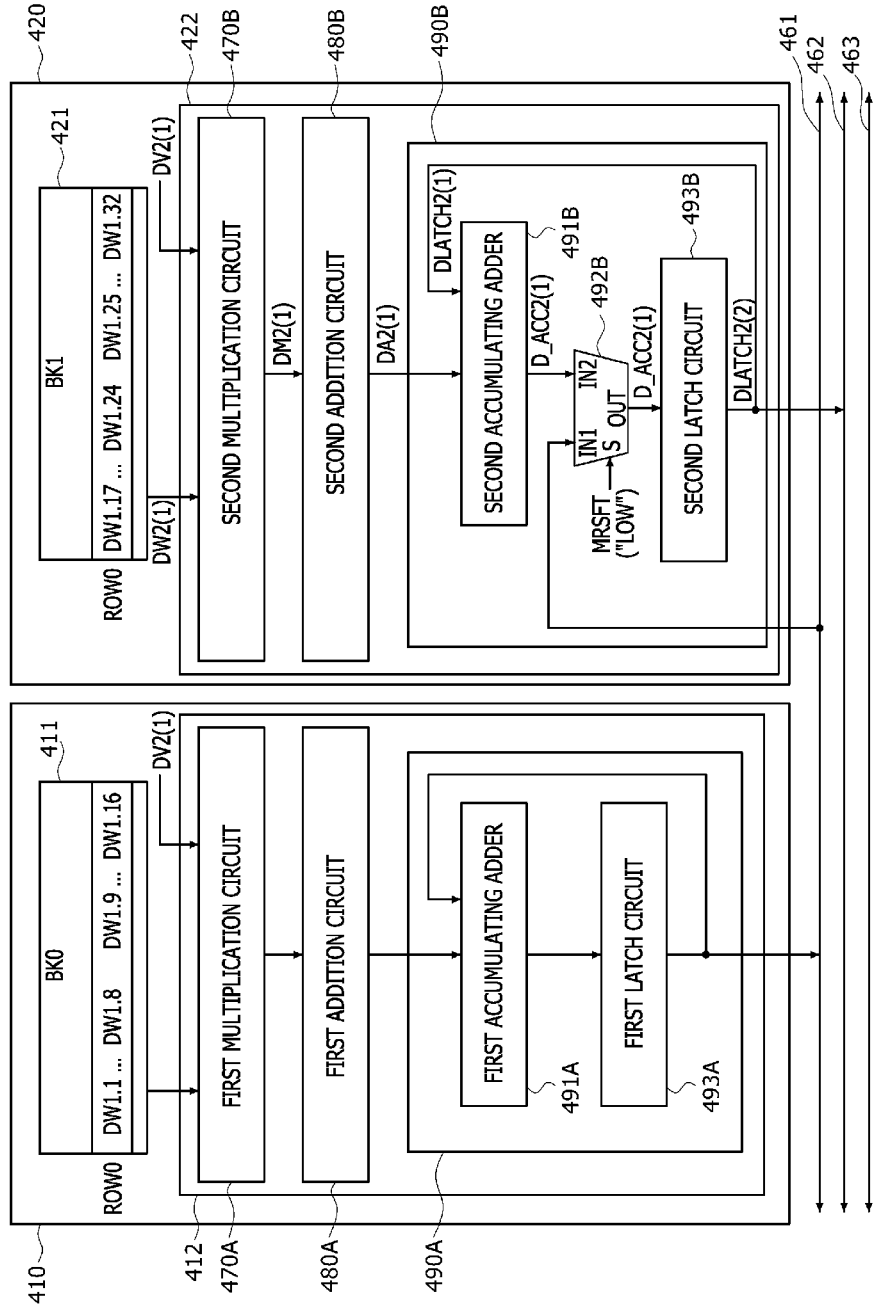
Figure 17:
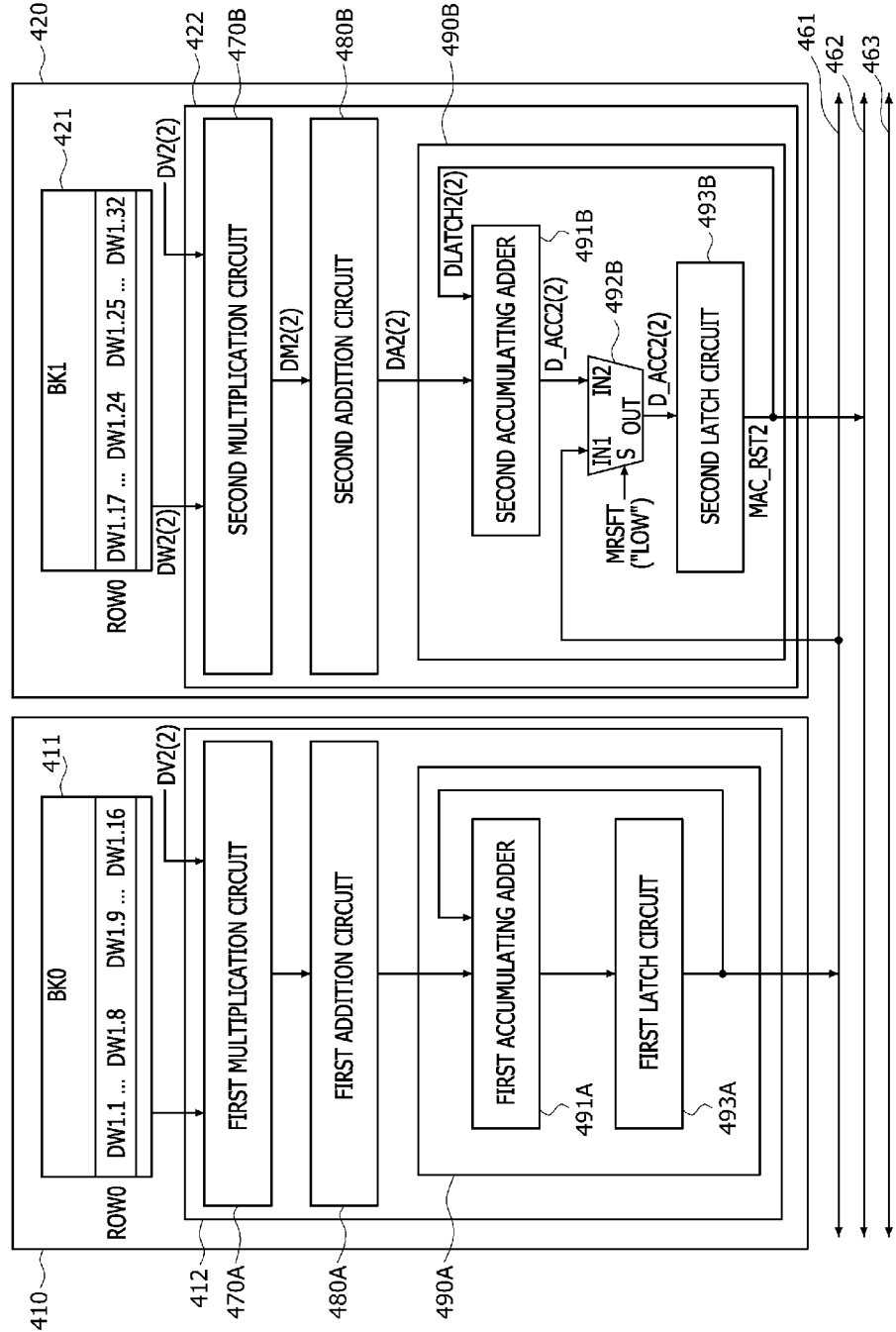

FIGS. 13 to 17 are diagrams illustrating an operation process in which the PIM device 40 of FIG. 6 performs the MAC operation according to the matrix operation of FIG. 7. In this example, it is assumed that the weight data are stored in the first memory bank 411 and the second memory bank 421 in the manner described with reference to FIG. 8. In FIGS. 13 to 17, the buffer memory (430 in FIG. 6) is not shown, but it is assumed that vector data is stored in the buffer memory (430 in FIG. 6) in the manner described with reference to FIGS. 9 and 10. Accordingly, in FIGS. 13 to 17, the vector data may be provided from the buffer memory (430 in FIG. 6). In addition, it is assumed that each of the first multiplication circuit 470A and the second multiplication circuit 470B have the same configuration as the multiplication circuit 310 described with reference to FIG. 4, and each of the first addition circuit 480A and the second addition circuit 480B have the same configuration as the addition circuit 320 described with reference to FIG. 5. FIG. 13 illustrates a first operation process of the first MAC operation of the PIM device 40, and FIG. 14 illustrates a second operation process of the first MAC operation of the PIM device 40. FIGS. 15 and 16 illustrate a first operation process of a second MAC operation of the PIM device 40, and FIG. 17 illustrates a second operation process of the second MAC operation of the PIM device 40.

Referring to FIG. 13, in order to provide weight data for performing the MAC operation, the first memory bank 411 and the second memory bank 421 may receive an active control signal ACT from a command/address decoder (440 of FIG. 6). Although not shown in the drawings, the first memory bank 411 and the second memory bank 421 may also receive a first row address for designating a row to be activated. The row ROW0 in which the first set DW1.1-DW1.16 of the weight data is to be stored in the first memory bank 411 may be activated, and the row ROW0 in which the second set DW1.17-DW1.32 of the weight data is to be stored in the second memory bank 421 may be activated. When the row ROW0 is activated in each of the first memory bank 411 and the second memory bank 421, the first memory bank 411 may transmit the first group DW1(1) among data of the first set DW1.1-DW1.16 of the weight data stored in the first row ROW0, designated by a first column address, that is, "DW1.1-DW1.8" to the first MAC operator 412 in response to the first column address and a MAC operation control signal MAC. In addition, the buffer memory (430 in FIG. 6) may provide the first group DV1(1) of the first set DV1.1-DV16.1 of the vector data, that is, "DV1.1-DV8.1" to the first MAC operator 412 and the second MAC operator 422.

The first multiplication circuit 470A of the first MAC operator 412 may perform a multiplication operation on the first group DW1(1) of the first set DW1 of the weight data and the first group DV1(1) of the first set DV1 of the vector data. In the same manner as described with reference to FIG. 4, the first multiplication circuit 470A may output the first group DM1(1) of the first multiplication data, that is, "DW1.1×DV1.1, DW1.2×DV2.1, . . . , DW1.8×DV8.1" as a result of the multiplication operation. The first addition circuit 480A may perform an addition operation on the first group DM1(1) of the first multiplication data. In the same manner as described with reference to FIG. 5, the first addition circuit 480A may output primary first addition data DA1(1), which is the operation result of "(DW1.1×DV1.1)+(DW1.2×DV2.1)+ . . . +(DW1.8×DV8.1)", as a result of the addition operation. The primary first addition data DA1(1) may be transmitted to a first input terminal of the first accumulating adder 491A of the first accumulator 490A.

Because the previous MAC operation is not performed, the first latch circuit 493A is in an initialized state, and therefore, the first latch data might not be transmitted to a second input terminal of the first accumulator 491A. In another example, initial latch data of "0" may be transmitted to the second input terminal of the first accumulating adder 491A. The first accumulating adder 491A may output the primary first addition data DA1(1) as primary first accumulation data DACC1(1). Accordingly, the primary first accumulation data DACC1(1) may be the same as the operation result of "(DW1.1×DV1.1)+(DW1.2×DV2.1)+ . . . +(DW1.8×DV8.1)". The first latch circuit 493A may latch the primary first accumulation data DACC1(1) output from the first accumulating adder 491A to output the latched primary first accumulation data DACC1(1) as primary first latch data DLATCH1(1). The primary first latch data DLATCH1(1) may be fed back to the second input terminal of the first accumulating adder 491A.

Referring to FIG. 14, a second column address and a MAC operation control signal MAC are transmitted to the first memory bank 411, and accordingly, the first memory bank 411 may transmit the second group DW1(2) designated by the second column address among data of the first set DW1.1-DW1.16 of the weight data stored in the first row ROW0, that is, "DW1.9-DW1.16" to the first MAC operator 412. In addition, the buffer memory (430 in FIG. 6) may provide the second group DV1(2) of the first set DV1.1-DV16.1 of the vector data, that is, "DV9.1-DV16.1" to the first MAC operator 412 and the second MAC operator 422.

The first multiplication circuit 470A of the first MAC operator 412 may perform a multiplication operation on the second group DW1(2) of the first set DW1 of the weight data and the second group DV1(2) of the first set DV1 of the vector data. In the same manner as described with reference to FIG. 4, the first multiplication circuit 470A may output second group DM1(2) of the first multiplication data, that is, "DW1.9×DV9.1, DW1.10×DV10.1, . . . , DW1.16×DV16.1" as a result of the multiplication operation. The first addition 480A may perform an addition operation on the second group DM1(2) of the first multiplication data. In the same manner as described with reference to FIG. 5, the first addition circuit 480A may output secondary first addition data DA1(2), which is an operation result of "(DW1.9×DV9.1)+(DW1.10×DV10.1)+ . . . +(DW1.16×DV16.1)" as a result of the addition operation. The secondary first addition data DA1(2) may transmitted to a first input terminal of the first accumulating adder 491A of the first accumulator 490A. Because the primary first latch data DLATCH1(1) is transmitted to a second input terminal of the first accumulating adder 491A, the first accumulating adder 491A may perform an addition operation on the secondary first addition data DA1(2) and the primary first latch data DLATCH1(1). The first accumulating adder 491A may output the addition operation result data as secondary first accumulation data D_ACC1(2). The secondary first accumulation data D_ACC1(2) may be the same as an operation result of "(DW1.1×DV1.1)+(DW1.2×DV2.1)+ . . . +(DW1.16×DV16.1)". The first latch circuit 493A may latch the secondary first accumulation data D_ACC1(2) output from the first accumulating adder 491A to output the latched secondary first accumulation data D_ACC1(2) as first MAC result data MAC_RST1. Because both the first operation and the second operation of the first MAC operation are completed, the first MAC result data MAC_RST1 output from the first latch circuit 493A may be transmitted to the first data input/output line 461.

Referring to FIG. 15, the first MAC result data MAC_RST1 transmitted from the first MAC operator 412 to the first data input/output line 461 may be transmitted to the first input terminal IN1 of the selector 492B constituting the second accumulator 490B of the second MAC operator 422. The selector 492B may receive a MAC result shift control signal MRSFT of a logic "high" level "HIGH" from the command/address decoder (440 of FIG. 6) through the selection terminal S. The selector 492B may output the first MAC result data MAC_RST1 through the output terminal OUT. The second latch circuit 493B may latch the first MAC result data MAC_RST1 output from the selector 492B to output the latched first MAC result data MAC_RST1 as primary second latch data DLATCH2(1). The primary second latch data DLATCH2(1) may be fed back to the second input terminal of the second accumulating adder 491B.

Referring to FIG. 16, a third column address and a MAC operation control signal MAC may be transmitted to the second memory bank 421, accordingly, the second memory bank 421 may transmit the first group DW2(1) of the second set DW1.17-DW1.32 of the weight data stored in the first row ROW0, designated by the third column address, that is, "DW1.17-DW1.24" to the second MAC operator 422. Because the row in which the second set DW1.17-DW1.32 of the weight data is stored among the rows of the second memory bank 421 is already activated as described with reference to FIG. 13, an additional activation operation might not be required. The buffer memory (430 of FIG. 6) may provide the first group DV2(1) of the second set DV17.1-DV32.1 of the vector data, that is, "DV17.1-DV24.1" to the first MAC operator 412 and the second MAC operator 422.

The second multiplication circuit 470B of the second MAC operator 422 may perform a multiplication operation on the first group DW2(1) of the second set DW2 of the weight data and the first group DV2(1) of the second set DV2 of the vector data. In the same manner as described with reference to FIG. 4, the second multiplication circuit 470B may output the first group DM2(1) of the second multiplication data, that is, "DW1.17×DV17.1, DW1.18×DV18.1, . . . , DW1.24×DV24.1" as a result of the multiplication operation. The second addition circuit 480B may perform an addition operation on the first group DM2(1) of the second multiplication data. In the same manner as described with reference to FIG. 4, the second addition circuit 480B may output primary second addition data DA2(1), which is a result of operation of "(DW1.17×DV17.1)+(DW1.18×DV18.1)+ . . . +(DW1.24×DV24.1)", as a result of the addition operation. The primary second addition data DA2(1) may be transmitted to a first input terminal of the second accumulating adder 491B of the second accumulator 490B. The second accumulating adder 491B may perform an addition operation on the primary second addition data DA2(1) and primary second latch data DLATCH2(1). The second accumulating adder 491B may output result data of the addition operation as primary second accumulation data D_ACC2(1). Because the primary second latch data DLATCH2(1) is the first MAC result data MAC_RST1, the primary second accumulation data D_ACC2(1) may be the same as an operation result of "(DW1.1×DV1.1)+(DW1.2×DV2.1)+ . . . +(DW1.24×DV24.1)".

The primary second accumulation data D_ACC2(1) output from the second accumulating adder 491B may be transmitted to the second input terminal IN2 of the selector 492B. The selector 492B may receive a MAC result shift control signal MRSFT of a logic "low" level "LOW" from the command/address decoder (440 of FIG. 6) through the selection terminal S. The selector 492B may output the primary second accumulation data D_ACC2(1) through the output terminal OUT. The second latch circuit 493B may latch the primary second accumulation data D_ACC2(1) output from the selector 492B to output the latched primary second accumulation data D_ACC2(1) as secondary second latch data DLATCH2(2). The secondary second latch data DLATCH2(2) may be fed back the second input terminal of the second accumulating adder 491B.

Referring to FIG. 17, a fourth column address and a MAC operation control signal MAC may be transmitted to the second memory bank 421, and accordingly, the second memory bank 421 may transmit the second group DW2(2) of the second set DW1.17-DW1.32 of the weight data stored in the first row ROW0, designated by the fourth column address, that is, "DW1.25-DW1.32" to the second MAC operator 422. Because the row in which the second set DW1.17-DW1.32 of the weight data is stored among the rows of the second memory bank 421 is already activated as described with reference to FIG. 13, an additional activation operation might not be required. The buffer memory (430 of FIG. 6) may provide the second group DV2(2) of the second set DV17.1-DV32.1 of the vector data, that is, "DV25.1-DV32.1" to the first MAC operator 412 and the second MAC operator 422.

The second multiplication circuit 470B of the second MAC operator 422 may perform a multiplication operation on the second group DW2(2) of the second set DW2 of the weight data and the second group DV2(2) of the second set DV2 of the vector data. In the same manner described with reference to FIG. 4, the second multiplication circuit 470B may output a second group DM2(2) of the second multiplication data, that is, "DW1.25×DV25.1, DW1.26×DV26.1, . . . , DW1.32×DV32.1" as a result of the multiplication operation. The second addition circuit 480B may perform an addition operation on the second group DM2(2) of the second multiplication data. In the same manner described with reference to FIG. 5, the second addition circuit 480B may output secondary second addition data DA2(2), which is an operation result of "(DW1.25×DV25.1)+(DW1.26×DV26.1)+ . . . +(DW1.32×DV32.1)" as a result of the addition operation. The secondary second addition data DA2(2) may be transmitted to the first input terminal of the second accumulating adder 491B of the second accumulator 490B. The second accumulating adder 491B may perform an addition operation on the secondary second addition data DA2(2) and the secondary second latch data DLATCH2(2). The second accumulating adder 491B may output the result data of the addition operation as secondary second accumulation data D_ACC2(2). Because the second latch data DLATCH2(2) is the same as an operation result of "(DW1.1×DV1.1)+(DW1.2×DV2.1)+ . . . +(DW1.24×DV24.1)", the secondary second accumulation data D_ACC2(2) may be the same as an operation result of "(DW1.1×DV1.1)+(DW1.2×DV2.1)+ . . . +(DW1.32×DV32.1)".

The secondary second accumulation data D_ACC2(2) output from the second accumulating adder 491B may be transmitted to the second input terminal IN2 of the selector 492B. The selector 492B may receive a MAC result shift control signal MRSFT of a logic low level "LOW" from the command/address decoder (440 of FIG. 6) through the selection terminal S. The selector 492B may output the secondary second accumulation data D_ACC2(2) through the output terminal OUT. The second latch circuit 493B may latch the secondary second accumulation data D_ACC2(2) output from the selector 492B. Because both the first operation and the second operation of the second MAC operation are completed, the second latch circuit 493B may output the latched data as second MAC result data MAC_RST2 and transmit the same to the second data input/output line 462.

Figure 18:
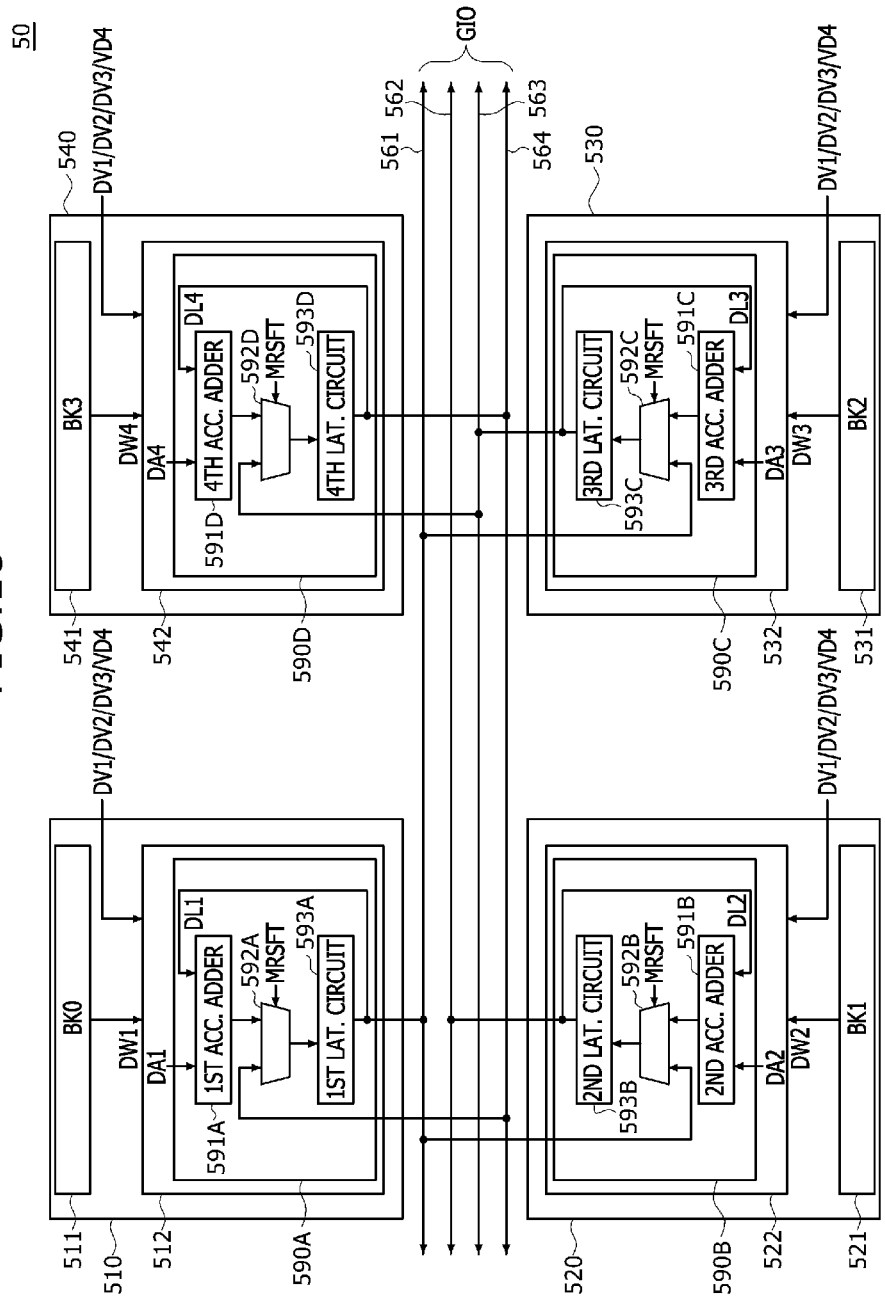
FIG. 18 is a diagram illustrating a PIM device according to another embodiment of the present disclosure.

FIG. 18 is a diagram illustrating a PIM device 50 according to another embodiment of the present disclosure. Referring to FIG. 18, the PIM device 50 may include first to fourth MAC units 510-540 and first to fourth data input/output lines (GIO) 561-564. Although not shown in the drawing, the PIM device 50 may include the buffer memory (430 of FIG. 6), the command/address decoder (440 of FIG. 6), and the data input/output terminal (450 of FIG. 6) described with reference to FIG. 6, and the configuration and operation thereof may be the same as those described with reference to FIG. 6.

The first MAC unit 510 may include a first memory bank (BK0) 511 and a first MAC operator 512. The first memory bank 511 may provide first weight data DW1 to the first MAC operator 512. The first MAC operator 512 may include a first accumulator 590A. Although not shown in the drawing, the first MAC operator 512 may include the multiplication circuit (310 of FIG. 3) and the addition circuit (320 of FIG. 3) described with reference to FIG. 3, and the configuration and operation thereof may be the same as those described with reference to FIGS. 3 to 5. Accordingly, the addition circuit of the first MAC operator 512 may transmit first addition data DA1 to the first accumulator 590A. The first accumulator 590A may include a first accumulating adder 591A, a first selector 592A, and a first latch circuit 593A. An operation of the first accumulator 590A may be the same as the operation of the second accumulator 490B described with reference to FIG. 12, and accordingly, overlapping descriptions will be omitted. A first input terminal of the first selector 592A may be coupled to the fourth data input/output line 564. Accordingly, the first selector 592A may receive MAC result data transmitted through the fourth data input/output line 564 to the first input terminal. An output terminal of the first latch 593A may be coupled to the first data input/output line 561. Accordingly, the MAC result data output from the first MAC unit 510 may be transmitted to the first data input/output line 561.

The second MAC unit 520 may include a second memory bank (BK1) 521 and a second MAC operator 522. The second memory bank 521 may provide second weight data DW2 to the second MAC operator 522. The second MAC operator 522 may include a second accumulator 590B. Although not shown in the drawing, the second MAC operator 522 may include the multiplication circuit (310 of FIG. 3) and the addition circuit (320 of FIG. 3) described with reference to FIG. 3, and the configuration and operation thereof may be the same as described with reference to FIGS. 3 to 5. Accordingly, the addition circuit of the second MAC operator 522 may transmit second addition data DA2 to the second accumulator 590B. The second accumulator 590B may include a second accumulating adder 591B, a second selector 592B, and a second latch circuit 593B. An operation of the second accumulator 590B may be the same as the operation of the second accumulator 490B described with reference to FIG. 12, and accordingly, overlapping descriptions will be omitted. A first input terminal of the second selector 592B may be coupled to the first data input/output line 561. Accordingly, the second selector 592B may receive the MAC result data transmitted through the first data input/output line 561, that is, the MAC result data output from the first MAC unit 510 through the first input terminal. An output terminal of the second latch circuit 593B may be coupled to the second data input/output line 562. Accordingly, the MAC result data output from the second MAC unit 520 may be transmitted to the second data input/output line 562.

The third MAC unit 530 may include a third memory bank (BK2) 531 and a third MAC operator 532. The third memory bank 531 may provide third weight data DW3 to the third MAC operator 532. The third MAC operator 532 may include a third accumulator 590C. Although not shown in the drawing, the third MAC operator 532 may include the multiplication circuit (310 of FIG. 3) and the addition circuit (320 of FIG. 3) described with reference to FIG. 3, and the configuration and operation thereof may be the same as described with reference to FIGS. 3 to 5. Accordingly, the addition circuit of the third MAC operator 532 may transmit third addition data DA3 to the third accumulator 590C. The third accumulator 590C may include a third accumulating adder 591C, a third selector 592C, and a third latch circuit 593C. An operation of the third accumulator 590C may be the same as the operation of the second accumulator 490B described with reference to FIG. 12, and accordingly, overlapping descriptions will be omitted. A first input terminal of the third selector 592C may be coupled to the second data input/output line 562. Accordingly, the third selector 592C may receive the MAC result data transmitted through the second data input/output line 562, that is, the MAC result data output from the second MAC unit 520 through the first input terminal. An output terminal of the third latch circuit 593C may be coupled to the third data input/output line 563. Accordingly, the MAC result data output from the third MAC unit 530 may be transmitted to the third data input/output line 563.

The fourth MAC unit 540 may include a fourth memory bank (BK3) 541 and a fourth MAC operator 542. The fourth memory bank 541 may provide fourth weight data DW4 to the fourth MAC operator 542. The fourth MAC operator 542 may include a fourth accumulator 590D. Although not shown in the drawing, the fourth MAC operator 542 may include the multiplication circuit (310 of FIG. 3) and the addition circuit (320 of FIG. 3) described with reference to FIG. 3, and the configuration and operation thereof may be the same as described with reference to FIGS. 3 to 5. Accordingly, the addition circuit of the fourth MAC operator 542 may transmit fourth addition data DA4 to the fourth accumulator 590D. The fourth accumulator 590D may include a fourth accumulating adder 591D, a fourth selector 592D, and a fourth latch circuit 593D. An operation of the third accumulator 590D may be the same as the operation of the second accumulator 490B described with reference to FIG. 12, and accordingly, overlapping descriptions will be omitted. A first input terminal of the fourth selector 592D may be coupled to the third data input/output line 563. Accordingly, the fourth selector 592D may receive the MAC result data transmitted through the third data input/output line 563, that is, the MAC result data output from the third MAC unit 530 through the first input terminal. An output terminal of the fourth latch circuit 593D may be coupled to the fourth data input/output line 564. Accordingly, the MAC result data output from the fourth MAC unit 540 may be transmitted to the first selector 591A of the first MAC unit 510 through the fourth data input/output line 564.

Figure 19:
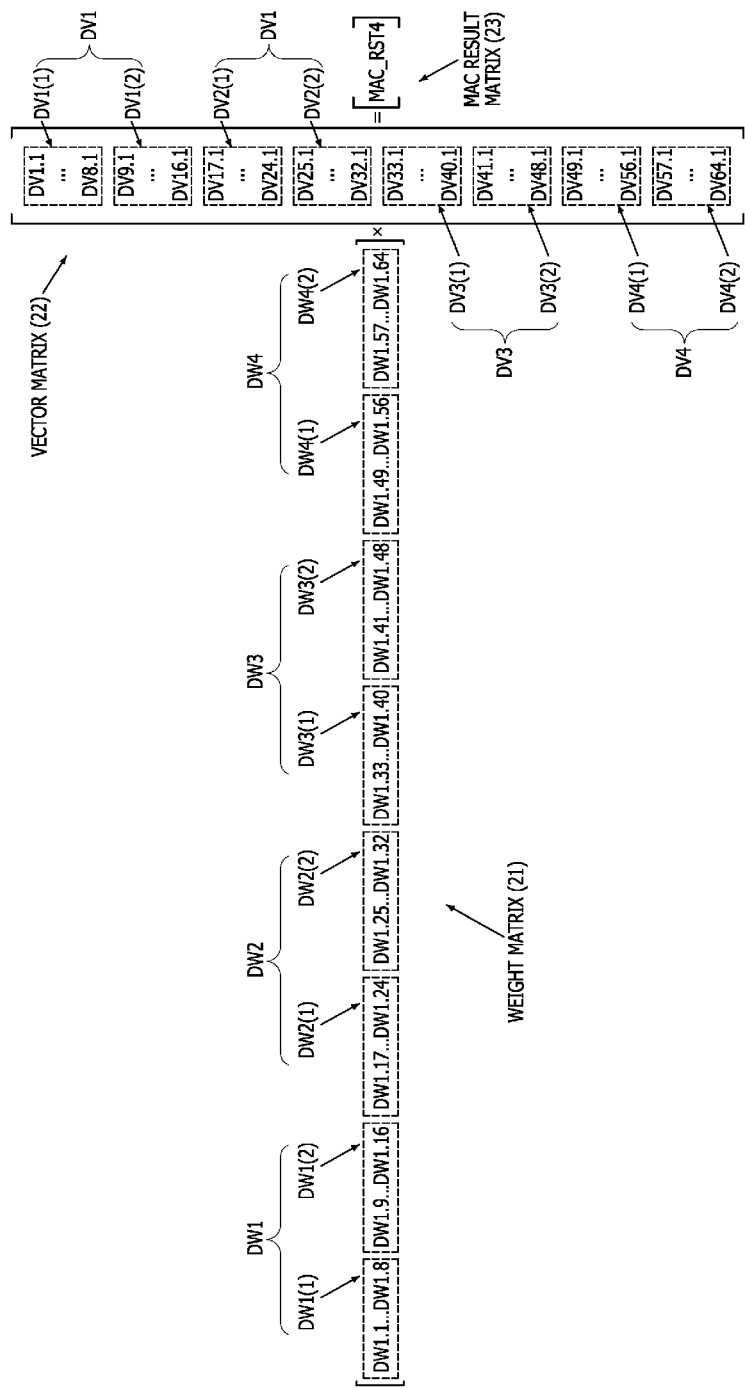
FIG. 19 is a diagram illustrating an example of a MAC operation performed in the PIM device of FIG. 18.

FIG. 19 is a diagram illustrating an example of a MAC operation performed in the PIM device 50 of FIG. 18. Referring to FIG. 19 together with FIG. 18, the PIM device 50 may perform a matrix multiplication operation on a 1×64 weight matrix 21 and a 64×1 vector matrix 22 to generate a 1×1 MAC result matrix 23. Hereinafter, it is assumed that the multiplication circuit of each of the first to fourth MAC units 510-540, as described with reference to FIG. 4, may perform a multiplication operation on eight first input data (i.e., weight data) and eight second input data (i.e., vector data). In addition, it is assumed that each of first to fourth memory banks 511, 521, 531, and 541 stores 16 weight data. In this case, the matrix multiplication operation for 64 weight data DW1.1-DW1.64 and 64 vector data DV1.1-DV64.1 may be performed through the first to fourth MAC operations performed by the first to fourth MAC units 510-540 and a summation operation on the result data of the first to fourth MAC operations.

The first MAC operation may be performed as a matrix multiplication operation on a first set DW1 of the weight data and a first set DV1 of the vector data. The first MAC operation may be performed by performing a first operation and a second operation of the first MAC operation and summing results of the first and second operations. The first operation of the first MAC operation may be performed as a matrix multiplication operation on a first group DW1(1) of the first set DW1 of the weight data and a first group DV1(1) of the first set DV1 of the vector data. The second operation of the first MAC operation may be performed as a matrix multiplication operation on a second group DW1(2) of the first set DW1 of the weight data and a second group DV1(2) of the first set DV1 of the vector data. The second MAC operation may be performed as a matrix multiplication operation on a second set DW2 of the weight data and a second set DV2 of the vector data. The second MAC operation may be performed by performing a first operation and a second operation of the second MAC operation, and summing results of the first and second operations. The first operation of the second MAC operation may be performed as a matrix multiplication operation on a first group DW2(1) of the second set DW2 of the weight data and a first group DV2(1) of the second set DV2 of the vector data. The second operation of the second MAC operation may be performed as a matrix multiplication operation on a second group DW2(2) of the second set DW2 of the weight data and a second group DV2(2) of the second set DV2 of the vector data.

The third MAC operation may be performed as a matrix multiplication operation on a third set DW3 of the weight data and a third set DV3 of the vector data. The third MAC operation may be performed by performing a first operation and a second operation of the third MAC operation, and summing results of the first and second operations. The first operation of the third MAC operation may be performed as a matrix multiplication operation on a first group DW3(1) of the third set DW3 of the weight data and a first group DV3(1) of the third set DV3 of the vector data. The second operation of the third MAC operation may be performed as a matrix multiplication operation on a second group DW3(2) of the third set DW3 of the weight data and a second group DV3(2) of the third set DV3 of the vector data. The fourth MAC operation may be performed as a matrix multiplication operation on a fourth set DW4 of the weight data and a fourth set DV4 of the vector data. The fourth MAC operation may be performed by performing a first operation and a second operation of the third MAC operation, and summing results of the first and second operations. The first operation of the fourth MAC operation may be performed as a matrix multiplication operation on a first group DW4(1) of the fourth set DW4 of the weight data and a first group DV4(1) of the fourth set DV4 of the vector data. The second operation of the fourth MAC operation may be performed as a matrix multiplication operation on a second group DW4(2) of the fourth set DW4 of the weight data and a second group DV4(2) of the fourth set DV4 of the vector data.

Figure 20:
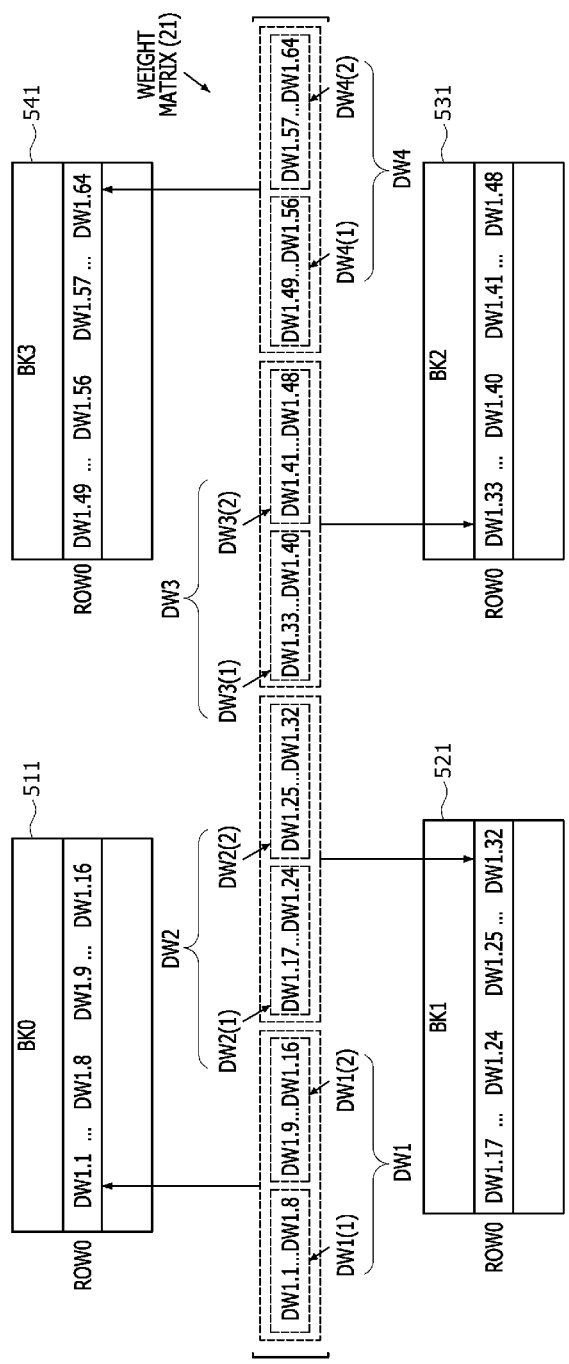
FIG. 20 is a diagram illustrating an example of a method in which first to fourth memory banks of the PIM device of FIG. 18 store weight data of FIG. 19.

FIG. 20 is a diagram illustrating an example of a method in which the first to fourth memory banks 511-541 of the PIM device 50 of FIG. 18 store the weight data DW1.1-DW1.64 of FIG. 19. In FIG. 20, the same reference numerals as in FIG. 19 denote the same components. Referring to FIG. 20, the first to $64^{th}$ elements of the first row of the weight matrix (21 of FIG. 19), that is, the first to $64^{th}$ weight data DW1.1-DW1.64 may be divided and stored in the first row ROW0 of each of the first to fourth memory banks (BK0-BK3) 511, 521, 531, and 541. Specifically, the first to sixteenth weight data DW1.1-DW1.16 may be stored in the first row ROW0 of the first memory bank 511. The $17^{th}$ to $32^{nd}$ weight data DW1.17-DW1.32 may be stored in the first row ROW0 of the second memory bank 521. The $33^{rd}$ to $48^{th}$ weight data DW1.33-DW1.48 may be stored in the first row ROW0 of the third memory bank 531. The $49^{th}$ to $64^{th}$ weight data DW1.49-DW1.64 may be stored in the first row ROW0 of the fourth memory bank 541. The first row ROW0 of each of the first to fourth memory banks 511, 521, 531, and 541 may have a common row address, and thus may be activated together by one active control signal ACT.

Figure 21:
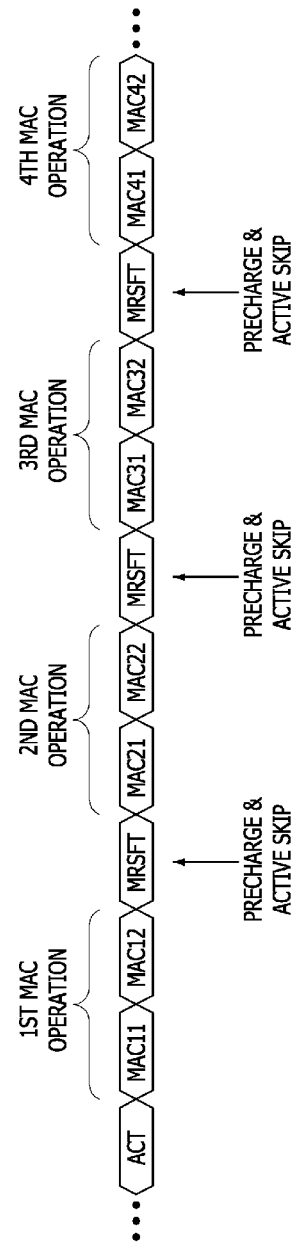
FIG. 21 is a diagram illustrating a process in which the PIM device of FIG. 18 performs the MAC operation of FIG. 19.

FIG. 21 is a diagram illustrating a process in which the PIM device 50 of FIG. 18 performs the MAC operation of FIG. 19. Referring to FIG. 21 together with FIGS. 18 to 20, when a row address designating the first row ROW0 and an active signal ACT are transmitted to the first to fourth memory banks 511, 521, 531, and 541, each of the first to fourth memory banks 511, 521, 531, and 541 may activate the first row ROW0. Next, first to fourth MAC operations may be performed. The first MAC operation may be performed in the first MAC unit 510. The first MAC unit 510 may generate and output first MAC result data as a result of the first MAC operation. The second MAC operation may be performed in the second MAC unit 520. The second MAC unit 520 may generate and output second MAC result data as a result of the second MAC operation. The third MAC operation may be performed in the third MAC unit 530. The third MAC unit 530 may generate and output third MAC result data as a result of the third MAC operation. The fourth MAC operation may be performed in the fourth MAC unit 540. The fourth MAC unit 540 may generate and output fourth MAC result data as a result of the fourth MAC operation. A precharge operation and an active operation may be omitted between each of the first to fourth operations, and a MAC result data shift operation according to the MAC result shift control signal MRSFT may be performed.

Specifically, when the first row ROW0 is activated by the active control signal ACT, the first MAC unit 510 may perform the first operation and the second operation of the first MAC operation. The first operation of the first MAC operation may be performed on the first group (DW1.1-DW1.8) DW1(1) of the first set DW1 of the weight data and the first group (DV1.1-DV8.1) DV1(1) of the first set DV1 of the vector data. The second operation of the first MAC operation may be performed on the second group (DW1.9-DW1.16) DW1(2) of the first set DW1 of the weight data and the second group (DV9.1-DV16.1) DV1(2) of the first set DV1 of the vector data. The first operation and the second operation of the first MAC operation may be performed in the same manner as described with reference to FIGS. 13 and 14. The first latch circuit 593A of the first MAC unit 510 may transmit the first MAC result data, which is a second operation result of the first MAC operation to the first data input/output line 561. The first MAC result data may be transmitted to the first input terminal of the second selector 592B constituting the second accumulator 522 of the second MAC unit 520 through the first data input/output line 561.

When a MAC result shift control signal MRSFT of a first logic level, for example, a logic "high" level is transmitted to the selection terminal of the second selector 592B constituting the second accumulator 522 of the second MAC unit 520, the second selector 592B may transmit the first MAC result data to the second latch circuit 593B. The second latch circuit 593B may transmit the first MAC result data to the second accumulating adder 591B. A logic level of the MAC result shift control signal MRSFT may be changed to a second logic level, for example, a logic "low" level, and the second MAC unit 520 may perform the first operation and the second operation of the second MAC operation. The first operation of the second MAC operation may be performed on the first group (DW1.17-DW1.24) DW2(1) of the second set DW2 of the weight data and the first group (DV17.1-DV24.1) DV2(1) of the second set DV2 of the vector data. The second operation of the second MAC operation may be performed on the second group (DW1.25-DW1.32) DW2(2) of the second set DW2 of the weight data and the second group (DV25.1-DV32.1) DV2(2) of the second set DV2 of the vector data. Because the first row ROW0 of the second memory bank 521 in which the second set DW2 (i.e., DW1.17-DW1.32) of the weight data is stored is already activated, the precharge and active operations may be omitted. The first operation and the second operation of the second MAC operation may be performed in the same manner as described with reference to FIGS. 13 and 14. The second latch circuit 593B of the second MAC unit 520 may transmit second MAC result data, which is a second operation result of the second MAC operation, to the second data input/output line 562. The second MAC result data may be the same as a result of the matrix multiplication operation on the first and second sets DW1.1-DW1.32 of the weight data and the first and second sets DV1.1-DV32.1 of the vector data. The second MAC result data may be transmitted to the first input terminal of the third selector 592C constituting the third accumulator 532 of the third MAC unit 530 through the second data input/output line 562.

Next, when a MAC result shift control signal MRSFT of a logic "high" level is transmitted to the selection terminal of the third selector 592C constituting the third accumulator 532 of the third MAC unit 530, the third selector 592C may transmit the second MAC result data to the third latch circuit 593C. The third latch circuit 593C may transmit the second MAC result data to the third accumulating adder 591C. A logic level of the MAC result shift control signal MRSFT may be changed into a logic "low" level, and the third MAC unit 530 may perform the first operation and the second operation of the third MAC operation. The first operation of the third MAC operation may be performed on the first group DW3(1) (i.e., DW1.33-DW1.40) of the third set DW3 of the weight data and the first group DV3(1) (i.e., DV33.1-DV40.1) of the third set DV3 of the vector data. The second operation of the third MAC operation may be performed on the second group DW3(2) (i.e., DW1.41-DW1.48) of the third set DW3 of the weight data and the second group DV3(2) (i.e., DV41.1-DV48.1) of the third set DV3 of the vector data. Because the first row ROW0 of the third memory bank 531 in which the third set DW3(2) (i.e., DW1.41-DW1.48) of the weight data is stored is already activated, the precharge and active operations may be omitted. The first operation and the second operation of the third MAC operation may be performed in the same manner as described with reference to FIGS. 13 and 14. The third latch circuit 593C of the third MAC unit 530 may transmit third MAC result data, which is a second operation result of the third MAC operation, to the third data input/output line 563. The third MAC result data may be the same as a result of the matrix multiplication operation on the first, second, and third sets DW1.1-DW1.48 of the weight data and the first, second, and third sets DV1.1-DV48.1 of the vector data. The third MAC result data may be transmitted to the first input terminal of the fourth selector 592D constituting the fourth accumulator 542 of the fourth MAC unit 540 through the third data input/output line 563.

Next, when a MAC result shift control signal MRSFT of a logic "high" level is transmitted to the selection terminal of the fourth selector 592D constituting the fourth accumulator 542 of the fourth MAC unit 540, the fourth selector 592D may transmit the third MAC result data to the fourth latch circuit 593D. The fourth latch circuit 593D may transmit the third MAC result data to the fourth accumulating adder 591D. A logic level of the MAC result shift control signal MRSFT may be changed into a logic "low" level, and the fourth MAC unit 540 may perform the first operation and the second operation of the fourth MAC operation. The first operation of the fourth MAC operation may be performed on the first group DW4(1) (i.e., DW1.49-DW1.56) of the fourth set DW4 of the weight data and the first group DV4(1) (i.e., DV49.1-DV56.1) of the fourth set DV4 of the vector data. The second operation of the fourth MAC operation may be performed on the second group DW4(2) (i.e., DW1.57-DW1.64) of the fourth set DW4 of the weight data and the second group DW4 (i.e., DW1.49-DW1.64) of the fourth set DV4 of the vector data. Because the first row ROW0 of the fourth memory bank 541 in which the fourth set DW4 (i.e., DW1.49-DW1.64) of the weight data is stored is already activated, the precharge and active operations may be omitted. The first operation and the second operation of the fourth MAC operation may be performed in the same manner as described with reference to FIGS. 13 and 14. The fourth latch circuit 593D of the fourth MAC unit 540 may transmit fourth MAC result data, which is a second operation result of the fourth MAC operation, to the fourth data input/output line 564. The fourth MAC result data may be the same as a result of the matrix multiplication operation on the first to fourth sets DW1.1-DW1.64 of the weight data and the first to fourth sets DV1.1-DV64.1 of the vector data.

FIG. 22 is a diagram illustrating another example of the MAC operation performed in the PIM device 50 of FIG. 18. Referring to FIG. 22 together with FIG. 18, the PIM device 50 may perform a matrix multiplication operation on a 2×32 weight matrix 31 and a 32×1 vector matrix 32 to generate a 2×1 result matrix 33. Hereinafter, it is assumed that the multiplication circuit of each of the first to fourth MAC units 510-540, as described with reference to FIG. 4, may perform a multiplication operation on eight first input data (i.e., weight data) and eight second input data (i.e., vector data). In addition, it is assumed that each of the first to fourth memory banks 511, 521, 531, and 541 stores 16 weight data. In this example, the first to fourth MAC units 510-540 may be referred to as a first even-numbered MAC unit, a first odd-numbered MAC unit, a second even-numbered MAC unit, and a second odd-numbered MAC unit, respectively. The weight data DW1.1-DW1.32 of a first row of the weight matrix 31 may constitute a first set. The weight data DW1.1-DW1.16 of first column to sixteenth column (first column group) among the weight data of the first set may constitute a first group of the first set, and the weight data DW1.17-DW1.32 of a $17^{th}$ column to $32^{nd}$ column (second column group) among the weight data of the first set may constitute a second group of the first set. The weight data DW2.1-DW2.32 of a second row of the weight matrix 31 may constitute a second set. The weight data DW2.1-DW2.16 of first column to sixteenth column (first column group) of the weight data of the second set may constitute a first group of the second set, and the weight data DW2.17-DW2.32 of $17^{th}$ column to $32^{nd}$ column (second column group) among the weight data of the second set may constitute a second group of the second set.

The first MAC operation may be performed as a matrix operation on the weight data DW1.1-DW1.16 of the first column to the sixteenth column of the weight data of the first row of the weight matrix 31 and the vector data DV1.1-DV16.1 of the first row to the sixteenth row of the vector matrix 32. The first MAC operation may include a first operation on the weight data DW1.1-DW1.8 of the first column to the eighth column among the weight data of the first row of the weight matrix 31 and the vector data DV1.1-DV8.1 of the first row to the eighth row of the vector matrix 32, and a second operation on the weight data DW1.9-DW1.16 of the ninth column to the sixteenth column among the weight data of the first row of the weight matrix 31 and the vector data DV9.1-DV16.1 of the ninth row to the sixteenth row of the vector matrix 32.

The second MAC operation may be performed as a matrix operation on the weight data DW2.1-DW2.16 of the first column to the sixteenth column among the weight data of the second row of the weight matrix 31 and the vector data DV1.1-DV16.1 of the first row to the sixteenth row of the vector matrix 32. The second MAC operation may include a first operation on the weight data DW2.1-DW2.8 of the first column to the eighth column among the weight data of the second row of the weight matrix 31 and the vector data DV1.1-DV8.1 of the first row to the eighth row of the vector matrix 32, and a second operation on the weight data DW2.9-DW2.16 of the ninth column to the sixteenth column among the weight data of the second row of the weight matrix 31 and the vector data DV9.1-DV16.1 of the first row to the eighth row of the vector matrix 32. The first MAC operation by the first MAC unit 510 and the second MAC operation by the third MC unit 530 may be performed simultaneously.

The third MAC operation may be performed as a matrix operation on the weight data DW1.17-DW1.32 of the $17^{th}$ column to the $32^{nd}$ column among the weight data of the first row of the weight matrix 31 and the vector data DV17.1-DV32.1 of the $17^{th}$ row to the $32^{nd}$ row of the vector matrix 32. The third MAC operation may include a first operation on the weight data DW1.17-DW1.24 of the $17^{th}$ column to the $24^{th}$ column among the weight data of the first row of the weight matrix 31 and the vector data DV17.1-DV24.1 of the $17^{th}$ row to the $24^{th}$ row of the vector matrix 32, and a second operation on the weight data DW1.25-DW1.32 of the $25^{th}$ column to the $32^{nd}$ column among the weight data of the first row of the weight matrix 31 and the vector data DV25.1-DV32.1 of the $25^{th}$ row to the $32^{nd}$ row of the vector matrix 32. The MAC result data MAC_RST11 of the first row of the MAC result matrix 33 may be the same as the third MAC result data generated as a result of the third MAC operation.

The fourth MAC operation may be performed as a matrix operation on the weight data DW2.17-DW2.32 of the $17^{th}$ column to the $32^{nd}$ column among the weight data of the second row of the weight matrix 31 and the vector data DV17.1-DV32.1 of the $17^{th}$ row to the $32^{nd}$ row of the vector matrix 32. The fourth MAC operation may include a first operation on the weight data DW2.17-DW2.24 of the $17^{th}$ column to the $24^{th}$ column among the weight data of the second row of the weight matrix 31 and the vector data DV17.1-DV24.1 of the $17^{th}$ row to the $24^{th}$ row of the vector matrix 32, and a second operation on the weight data DW2.25-DW2.32 of the $25^{th}$ column to the $32^{nd}$ column among the weight data of the second row of the weight matrix 31 and the vector data DV25.1-DV32.1 of the $25^{th}$ row to the $32^{nd}$ row of the vector matrix 32. The third MAC operation by the second MAC unit 520 and the fourth MAC operation by the fourth MC unit 540 may be performed simultaneously. The MAC result data MAC_RST21 of the second row of the MAC result matrix 33 may be the same as the fourth MAC result data generated as the fourth MAC operation.

Figure 23:
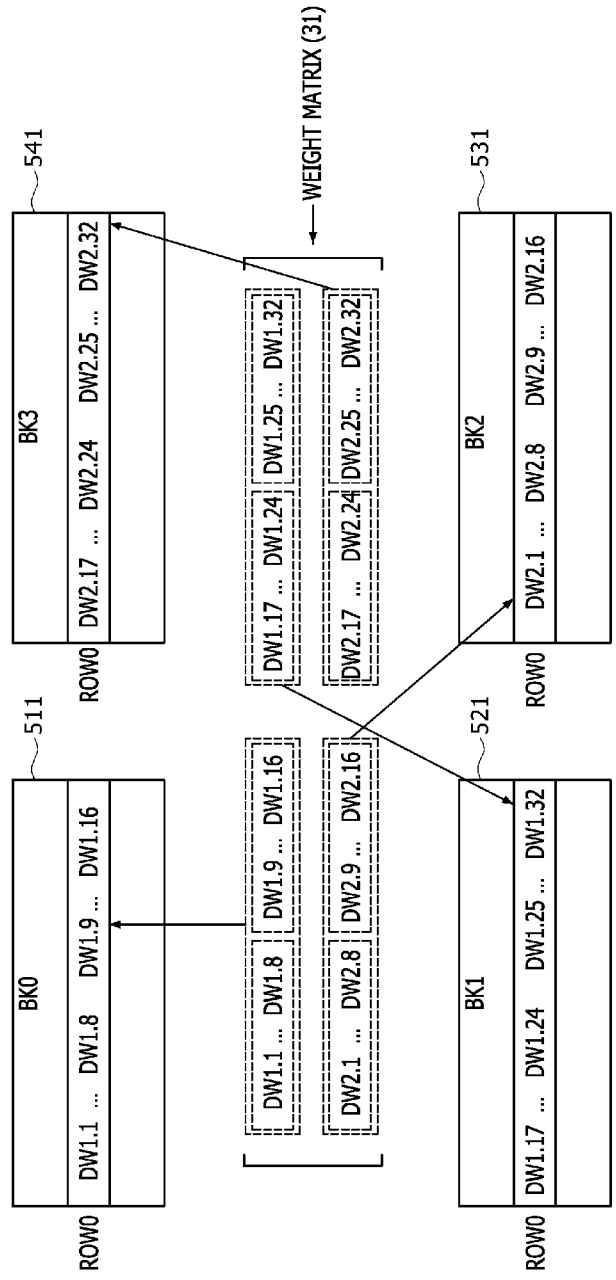
FIG. 23 is a diagram illustrating an example of a method in which the first to fourth memory banks of the PIM device of FIG. 18 store weight data of FIG. 22.

FIG. 23 is a diagram illustrating an example of a method in which the first to fourth memory banks 511-541 of the PIM device 50 of FIG. 18 store the weight data DW1.1-DW1.32 and DW2.1-DW2.32 of FIG. 22. In FIG. 23, the same reference numerals as those of FIG. 22 indicate the same components. Referring to FIG. 23, the weight data DW1.1-DW1.32 of the first row of the weight matrix (31 of FIG. 22) may be divided and stored in a first row ROW0 of each of the first and second memory banks (BK0 and BK1) 511 and 521. Specifically, the weight data DW1.1-DW1.16 of the first row and the first column to sixteenth column may be stored in the first row ROW0 of the first memory bank 511. The weight data DW1.17-DW1.32 of the first row and the $17^{th}$ column to $32^{nd}$ column may be stored in the first row ROW0 of the second memory bank 521. The weight data DW2.1-DW2.16 of the second row and the first column to sixteenth column may be stored in the first row ROW0 of the third memory bank 531. The weight data DW2.17-DW2.32 of the second row and the $17^{th}$ column to $32^{nd}$ column may be stored in the first row ROW0 of the fourth memory bank 541. The first row ROW0 of each of the first to fourth memory banks 511, 521, 531, and 541 may have a common row address, and thus may be activated together by one active control signal ACT.

Figure 24:
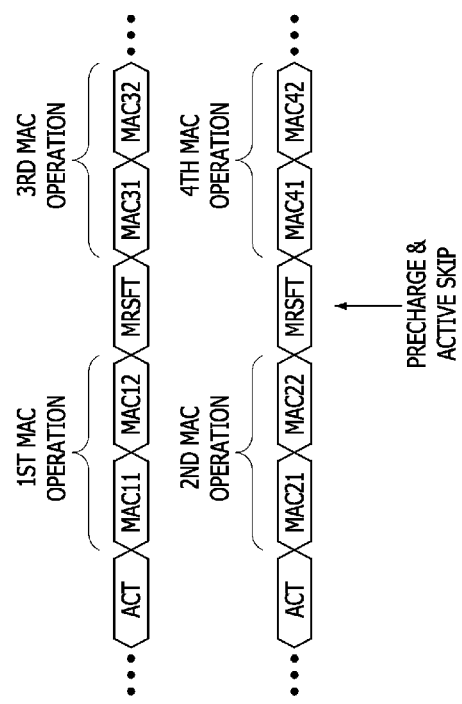
FIG. 24 is a diagram illustrating a process in which the PIM device of FIG. 18 performs a MAC operation of FIG. 22.

FIG. 24 is a diagram illustrating a process in which the PIM device 50 of FIG. 18 performs the MAC operation of FIG. 22. Referring to FIG. 24 together with FIGS. 18, 22, and 23, when a row address designating the first row ROW0 and an active control signal ACT are transmitted to the first to fourth memory banks 511, 521, 531, and 541, each of the first to fourth memory banks 511, 521, 531, and 541 may activate the first row ROW0. Next, the first and second MAC operations MAC11, MAC12, MAC21, MAC22 may be performed together, and the third and fourth MAC operations MAC31, MAC32, MAC41, MAC42 may be performed together. The first MAC operation MAC11 and MAC12 may be performed in the first MAC unit (i.e., first even-numbered MAC unit) 510. The first MAC unit 510 may generate and output first MAC result data as a result of the first MAC operation. The second MAC operation MAC21 and MAC22 may be performed in the third MAC unit (i.e., second even-numbered MAC unit) 530. The third MAC unit 530 may generate and output second MAC result data as a result of the second MAC operation. The third MAC operation MAC31 and MAC32 may be performed in the second MAC unit (i.e., first odd-numbered MAC unit) 520. The second MAC unit 520 may generate and output third MAC result data as a result of the third MAC operation. In addition, the fourth MAC operation MAC41 and MAC42 may be performed in the fourth MAC unit (i.e., second odd-numbered MAC unit) 540. The fourth MAC unit 540 may generate and output fourth MAC result data as a result of the fourth MAC operation. A prechrage and active operations may be omitted between the first and second operations MAC11, MAC12, MAC21, and MAC22 and the third and fourth operations MAC31, MAC32, MAC41, and MAC42, and a MAC result data shift operations by the MAC result shift control signal MRSFT may be performed.

Specifically, in a state where the first row ROW0 is activated by the active control signal ACT, the first MAC unit 510 and the third MAC unit 530 may perform the first operation and the second operation of the first MAC operation and the first operation and the second operation of the second MAC operation, respectively. The first operation of the first MAC operation may be performed on the weight data DW1.1-DW1.8 of the first row and the first column to eighth column of the weight matrix 31 and the vector data DV1.1-DV8.1 of the first row to the eighth row of the vector matrix 32. The first operation of the second MAC operation may be performed on the weight data DW2.1-DW2.8 of the second row and the first column to eighth column of the weight matrix 31 and the vector data DV1.1-DV8.1 of the first row to the eighth row of the vector matrix 32. The second operation of the first MAC operation may be performed on the weight data DW1.9-DW1.16 of the first row and the ninth column to sixteenth column of the weight matrix 31 and the vector data DV9.1-DV9.1 of the ninth row to the sixteenth row of the vector matrix 32. The second operation of the second MAC operation may be performed on the weight data DW2.9-DW2.16 of the second row and the ninth column to sixteenth column of the weight matrix 31 and the vector data DV9.1-DV16.1 of the ninth row to the sixteenth row of the vector matrix 32. As a result of the second operation of the first MAC operation, first MAC result data may be generated, and as a result of the second operation of the second MAC operation, second MAC result data may be generated. The first MAC result data may be transmitted to the second selector 592B of the second MAC unit 520 through the first data input/output line 561. The second MAC result data may be transmitted to the fourth selector 592D of the fourth MAC unit 540 through the third data input/output line 563.

When a MAC result shift control signal MRSFT of a first logic level, for example, logic "high" level is transmitted, the second selector 592B of the second MAC unit 520 may transmit the first MAC result data to the second latch circuit 593B. The second latch circuit 593B may transmit the first MAC result data to the second accumulating adder 591B. A logic level of the MAC result shift control signal MRSFT may be changed to a second logic level, for example, a logic "low" level, and the second MAC unit 520 and the fourth MAC unit 540 may perform the first operation and the second operation of the third MAC operation and the first operation and the second operation of the fourth MAC operation, respectively. Because the first row ROW0 of the second memory bank 521 and the first row ROW0 of the fourth memory bank 541 in which the weight data DW1.17-DW1.32, DW2.17-DW2.32 of the $17^{th}$ column to the $32^{nd}$ column of the weight matrix 31 are already activated, prechrage and active operations may be omitted.

The first operation of the third MAC operation may be performed on the weight data DW1.17-DW1.24 of the first row and the $17^{th}$ column to $24^{th}$ column of the weight matrix 31 and the vector data DV17.1-DV24.1 of the $17^{th}$ row to the $24^{th}$ row of the vector matrix 32. The first operation of the fourth MAC operation may be performed on the weight data DW2.17-DW2.24 of the second row and the $17^{th}$ column to $24^{th}$ column of the weight matrix 31 and the vector data DV17.1-DV24.1 of the $17^{th}$ row to $24^{th}$ row of the vector matrix 32. The second operation of the third MAC operation may be performed on the weight data DW1.25-DW1.32 of the first row and the $25^{th}$ column to $32^{nd}$ column of the weight matrix 31 and the vector data DV25.1-DV32.1 of the $25^{th}$ row to $32^{nd}$ row of the vector matrix 32. The second operation of the fourth MAC operation may be performed on the weight data DW2.25-DW2.32 of the second row and the $25^{th}$ column to $32^{nd}$ column of the weight matrix 31 and the vector data DV25.1-DV32.1 of the $25^{th}$ row to the $32^{nd}$ row of the vector matrix 32. As a result of the second operation of the third MAC operation, third MAC result data may be generated, and as a result of the second operation of the fourth MAC operation, fourth MAC result data may be generated. The third MAC result data may be transmitted to the second data input/output line 562, and the fourth MAC result data may be transmitted to the fourth data input/output line 564. The third MAC result data and the fourth MAC result data may constitute the MAC result data MAC_RST11 of the first row of the MAC result matrix and the MAC result data MAC_RST21 of the second row of the MAC result matrix, respectively.

A limited number of possible embodiments for the present teachings have been presented above for illustrative purposes. Those of ordinary skill in the art will appreciate that various modifications, additions, and substitutions are possible. While this patent document contains many specifics, these should not be construed as limitations on the scope of the present teachings or of what may be claimed, but rather as descriptions of features that may be specific to particular embodiments. Certain features that are described in this patent document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

What is claimed is:

1. A processing-in-memory (PIM) device comprising:
   a first operational logic unit configured to perform a first operation on a first set of first input data and a first set of second input data to output first operation result data;
   a second operational logic unit configured to perform a second operation on a second set of the first input data and a second set of the second input data to output second operation result data; and
   a buffer memory configured to provide the first set and the second set of the second input data to the first operational logic unit and the second operational logic unit, respectively,
   wherein the second operational logic unit is configured to receive the first operation result data from the first operational logic unit and to perform the second operation using the first operation result data as initial latch data,
   wherein the first operational logic unit comprises:
      a first memory circuit configured to store the first set of the first input data; and
      a first operational logic circuit configured to receive the first set of the first input data and the first set of the second input data from the first memory circuit and the buffer memory device, respectively, to perform the first operation, and
   wherein the second operational logic unit comprises:
      a second memory circuit configured to store the second set of the first input data; and
      a second operational logic circuit configured to receive the second set of the first input data and the second set of the second input data from the second memory circuit and the buffer memory device, respectively, to perform the second operation,
   wherein the first set of the first input data in the first memory circuit and the first set of the second input data of the buffer memory device are designated by the same first column address, and
   wherein the second set of the first input data in the first memory circuit and the second set of the second input data of the buffer memory device are designated by the same second column address.

2. The PIM device of claim 1, wherein the first memory circuit and the second memory circuit are activated together in response to an active signal and commonly precharged in response to a precharge signal.

3. The PIM device of claim 2, wherein a row in which the first set of the first input data is stored in the first memory circuit and a row in which the second set of the first input data is stored in the second memory circuit are designated by the same row address and activated and precharged together by the same active control signal and precharge control signal.

4. The PIM device of claim 1,
   wherein the first operational logic circuit comprises:
      a first multiplication circuit configured to perform a multiplication operation on the first set of the first input data and the first set of the second input data to output first multiplication data;
      a first addition circuit configured to add the first multiplication data to output first addition data; and
      a first accumulator configured to perform a accumulation operation on the first addition data.

5. The PIM device of claim 4, wherein the first accumulator comprises:
      a first accumulating adder configured to add the first addition data and first latch data to output first accumulation data; and
      a first latch circuit configured to latch the first accumulation data to transmit latched first accumulation data into the first accumulating adder as the first latch data.

6. The PIM device of claim 5, wherein the first latch circuit is configured to transmit the first latch data through a data input and output line to the second operational logic unit as the first operation result data.

7. The PIM device of claim 6,
   wherein the second operational logic circuit comprises:
      a second multiplication circuit configured to perform a multiplication operation on the second set of the first input data and the second set of the second input data to output second multiplication data;
      a second addition circuit configured to add the second multiplication data to output second addition data; and
      a second accumulator configured to perform a second accumulation operation on the second addition data, and
   wherein the second accumulator comprises:
      a second accumulating adder configured to add the second addition data and second latch data to output second accumulation data;
      a selector configured to receive the first operation result data and the second accumulation data and output one of the first operation result data and the second accumulation data as selection data; and
      a second latch circuit configured to latch the selection data output from the selector to transmit latched selection data into the second accumulating adder as the second latch data.

8. The PIM device of claim 7, wherein the selector is configured to transmit the first operation result data to the second latch circuit as the selection data before the second operational logic unit starts to perform the second operation.

9. The PIM device of claim 8, wherein the selector is configured to transmit the second accumulation data to the second latch circuit as the selection data after the first operation result data is transmitted to the second accumulating adder as the second latch data.

* * * * *